US009153458B2

(12) United States Patent
Light et al.

(10) Patent No.: US 9,153,458 B2

(45) Date of Patent: *Oct. 6, 2015

(54) METHODS OF FORMING A PATTERN ON A SUBSTRATE

(71) Applicant: Micron Technology, Inc., Boise, ID (US)

(72) Inventors: Scott L. Light, Boise, ID (US); Anton deVilliers, Clifton Park, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/064,261

(22) Filed: Oct. 28, 2013

(65) Prior Publication Data

US 2014/0051251 A1 Feb. 20, 2014

Related U.S. Application Data

(63) Continuation of application No. 13/101,485, filed on May 5, 2011, now Pat. No. 8,575,032.

(51) Int. Cl.

*H01L 21/311* (2006.01)
*H01L 21/033* (2006.01)

(52) U.S. Cl.

CPC ...... *H01L 21/31144* (2013.01); *H01L 21/0337* (2013.01); *H01L 21/0338* (2013.01)

(58) Field of Classification Search

CPC ............ H01L 21/0337; H01L 21/0338; H01L 21/31144

USPC .......................................................... 438/703

See application file for complete search history.

(56) References Cited

U.S. PATENT DOCUMENTS

| | | | |
|---|---|---|---|
| 4,910,168 | A | 3/1990 | Tsai |
| 5,008,207 | A | 4/1991 | Blouse et al. |
| 5,013,680 | A | 5/1991 | Lowrey et al. |
| 5,047,117 | A | 9/1991 | Roberts |
| 5,254,218 | A | 10/1993 | Roberts et al. |

(Continued)

FOREIGN PATENT DOCUMENTS

| | | |
|---|---|---|
| CN | 1550889 | 12/2004 |
| CN | 1752844 | 3/2006 |

(Continued)

OTHER PUBLICATIONS

U.S. Appl. No. 11/714,378, filed Mar. 5, 2007, PreliminaryAmendement.

(Continued)

*Primary Examiner* — Shaun Campbell

(74) *Attorney, Agent, or Firm* — Wells St. John, P.S.

(57) ABSTRACT

A method of forming a pattern on a substrate includes forming a repeating pattern of four first lines elevationally over an underlying substrate. A repeating pattern of four second lines is formed elevationally over and crossing the repeating pattern of four first lines. First alternating of the four second lines are removed from being received over the first lines. After the first alternating of the four second lines have been removed, elevationally exposed portions of alternating of the four first lines are removed to the underlying substrate using a remaining second alternating of the four second lines as a mask. Additional embodiments are disclosed and contemplated.

26 Claims, 19 Drawing Sheets

10 20 20 20 24 23 23 A A E 30 Q C F G G H E 30 24

(56) References Cited

U.S. PATENT DOCUMENTS 5,328,810 A 7/1994 Lowrey et al.
5,372,916 A 12/1994 Ogawa et al.
5,382,315 A 1/1995 Kumar
5,420,067 A 5/1995 Hsu
5,429,988 A 7/1995 Huang et al.
5,573,837 A 11/1996 Roberts et al.
5,593,813 A 1/1997 Kim
5,905,279 A 5/1999 Nitayama et al.
5,916,821 A 6/1999 Kerber
6,063,688 A 5/2000 Doyle et al.
6,087,263 A 7/2000 Clampitt et al.
6,140,217 A 10/2000 Jones et al.
6,174,818 B1 1/2001 Tao et al.
6,207,490 B1 3/2001 Lee
6,235,574 B1 5/2001 Tobben et al.
6,249,335 B1 6/2001 Hirukawa et al.
6,303,272 B1 10/2001 Furukawa et al.
6,352,932 B1 3/2002 Clampitt et al.
6,383,952 B1 5/2002 Subramanian et al.
6,429,123 B1 8/2002 Tseng
6,483,136 B1 11/2002 Yoshida et al.
6,545,904 B2 4/2003 Tran
6,548,385 B1 4/2003 Lai
6,548,401 B1 4/2003 Trivedi
6,566,280 B1 5/2003 Meagley et al.
6,580,136 B2 6/2003 Mandelman et al.
6,599,844 B2 7/2003 Koh et al.
6,605,541 B1 8/2003 Yu
6,627,524 B2 9/2003 Scott
6,630,379 B2 10/2003 Mandelman et al.
6,638,441 B2 10/2003 Chang et al.
6,649,956 B2 11/2003 Yoshida et al.
6,667,502 B1 12/2003 Agarwal et al.
6,703,323 B2 3/2004 Kong et al.
6,710,390 B2 3/2004 Parekh et al.
6,734,107 B2 5/2004 Lai et al.
6,735,132 B2 5/2004 Siek
6,753,220 B2 6/2004 Juengling
6,756,619 B2 6/2004 Tran
6,774,051 B2 8/2004 Chung et al.
6,811,817 B2 11/2004 Sugeta et al.
6,826,069 B2 11/2004 Kurjanowicz et al.
6,864,184 B1 3/2005 Gabriel
6,872,512 B2 3/2005 Yamashita
6,905,975 B2 6/2005 Boettiger et al.
6,916,594 B2 7/2005 Bok et al.
6,951,822 B2 10/2005 Scholz
6,977,404 B2 12/2005 Katsumata et al.
7,023,069 B2 4/2006 Blanchard
7,037,840 B2 5/2006 Katz
7,042,038 B2 5/2006 Yoshida et al.
7,049,652 B2 5/2006 Mokhlesi et al.
7,064,376 B2 6/2006 Shau
7,067,385 B2 6/2006 Manning
7,074,533 B2 7/2006 Fuller et al.
7,098,105 B2 8/2006 Juengling
7,115,525 B2 10/2006 Abatchev et al.
7,125,781 B2 10/2006 Manning et al.
7,151,040 B2 12/2006 Tran et al.
7,166,533 B2 1/2007 Happ
7,199,005 B2 4/2007 Sandhu et al.
7,202,127 B2 4/2007 Musch et al.
7,202,174 B1 4/2007 Jung et al.
7,230,292 B2 6/2007 Graettinger
7,253,118 B2 8/2007 Tran et al.
7,265,059 B2 9/2007 Rao et al.
7,271,108 B2 9/2007 Sadjadi
7,320,911 B2 1/2008 Basceri et al.
7,339,252 B2 3/2008 Blanchard
7,361,609 B2 4/2008 Hah et al.
7,384,849 B2 6/2008 Parekh et al.
7,387,939 B2 6/2008 Manning
7,390,749 B2 6/2008 Kim et al.
7,390,750 B1 6/2008 Ramkumar et al.
7,396,781 B2 7/2008 Wells
7,439,152 B2 10/2008 Manning
7,442,976 B2 10/2008 Juengling
7,517,753 B2 4/2009 Manning
7,521,371 B2 4/2009 DeBruler
7,521,378 B2 4/2009 Fucsko et al.
7,524,607 B2 4/2009 Ho et al.
7,537,866 B2 5/2009 King Liu
7,544,563 B2 6/2009 Manning
7,553,760 B2 6/2009 Yang et al.
7,557,013 B2 7/2009 Bhat et al.
7,557,015 B2 7/2009 Sandhu et al.
7,582,412 B2 9/2009 Cameron et al.
7,682,924 B2 3/2010 Bhat et al.
7,687,387 B2 3/2010 Inaba et al.
7,696,076 B2 4/2010 Jung et al.
7,713,818 B2 5/2010 Chan
7,754,591 B2 7/2010 Jung
7,790,357 B2 9/2010 Jung
7,790,360 B2 9/2010 Alapati et al.
7,807,575 B2 10/2010 Zhou
7,842,601 B2 11/2010 Lee et al.
7,846,646 B2 12/2010 Kamijima
7,851,135 B2 12/2010 Jung et al.
7,855,038 B2 12/2010 Hah et al.
7,897,460 B2 3/2011 Parekh et al.
7,923,371 B2 4/2011 Shinohe
7,959,818 B2 6/2011 Jung
8,067,286 B2 11/2011 Parekh et al.
8,083,953 B2 12/2011 Millward et al.
8,083,958 B2 12/2011 Li et al.
8,148,052 B2 4/2012 Vanleenhove et al.
8,247,302 B2 8/2012 Sills
8,273,634 B2 9/2012 Sills
8,338,304 B2 12/2012 Zhou
8,440,576 B2 5/2013 Hong
8,575,032 B2 * 11/2013 Light et al. .................... 438/703
8,629,048 B1 1/2014 Sipani et al.
8,629,527 B2 1/2014 Parekh et al.
8,796,155 B2 8/2014 Sills
2002/0037617 A1 3/2002 Kim et al.
2002/0043690 A1 4/2002 Doyle et al.
2002/0094688 A1 7/2002 Mitsuiki
2002/0130348 A1 9/2002 Tran
2003/0001214 A1 1/2003 Yoshida et al.
2003/0006410 A1 1/2003 Doyle
2003/0008968 A1 1/2003 Sugeta et al.
2003/0091936 A1 5/2003 Rottstegge et al.
2003/0096903 A1 5/2003 Sugeta et al.
2004/0043546 A1 3/2004 Makoto et al.
2004/0198065 A1 10/2004 Lee et al.
2004/0253535 A1 12/2004 Cameron et al.
2005/0058950 A1 3/2005 Sugeta et al.
2005/0130068 A1 6/2005 Kondoh et al.
2005/0142497 A1 6/2005 Ryou et al.
2005/0164478 A1 7/2005 Chan et al.
2005/0173740 A1 8/2005 Jin
2005/0215040 A1 9/2005 Doyle
2005/0255696 A1 11/2005 Makiyama et al.
2005/0272220 A1 12/2005 Waldfried et al.
2006/0011947 A1 1/2006 Juengling
2006/0024621 A1 2/2006 Nolscher et al.
2006/0046200 A1 3/2006 Abatchev et al.
2006/0046422 A1 3/2006 Tran et al.
2006/0046484 A1 3/2006 Abatchev et al.
2006/0063384 A1 3/2006 Hah et al.
2006/0088788 A1 4/2006 Kudo et al.
2006/0099347 A1 5/2006 Sugeta et al.
2006/0115978 A1 6/2006 Specht et al.
2006/0118785 A1 6/2006 Allen et al.
2006/0154182 A1 7/2006 Brodsky
2006/0240361 A1 10/2006 Lee et al.
2006/0262511 A1 11/2006 Abatchev et al.
2006/0263699 A1 * 11/2006 Abatchev et al. ................. 430/5
2006/0273456 A1 12/2006 Sant et al.
2006/0278911 A1 12/2006 Eppich
2006/0281266 A1 12/2006 Wells
2006/0286795 A1 12/2006 Yosho
2007/0003878 A1 1/2007 Paxton et al.
2007/0010058 A1 1/2007 Juengling

(56) References Cited

U.S. PATENT DOCUMENTS

2007/0020565 A1 1/2007 Koh et al.
2007/0023805 A1 2/2007 Wells et al.
2007/0026684 A1 2/2007 Parascandola et al.
2007/0037066 A1 2/2007 Hsiao
2007/0045712 A1 3/2007 Haller et al.
2007/0048674 A1 3/2007 Wells
2007/0048930 A1 3/2007 Figura et al.
2007/0049003 A1 3/2007 Smythe
2007/0049011 A1 3/2007 Tran
2007/0049030 A1 3/2007 Sandhu et al.
2007/0049035 A1 3/2007 Tran
2007/0049040 A1 3/2007 Bai et al.
2007/0077524 A1 4/2007 Koh et al.
2007/0077743 A1 4/2007 Rao et al.
2007/0085152 A1 4/2007 Butler et al.
2007/0096182 A1 5/2007 Schloesser et al.
2007/0099431 A1 5/2007 Li
2007/0105357 A1 5/2007 Nejad et al.
2007/0123015 A1 5/2007 Chinthakindi et al.
2007/0145464 A1 6/2007 Voshell et al.
2007/0148984 A1 6/2007 Abatchev et al.
2007/0161251 A1 7/2007 Tran et al.
2007/0181929 A1 8/2007 Juengling
2007/0190463 A1 8/2007 Sandhu et al.
2007/0197014 A1 8/2007 Jeon et al.
2007/0202671 A1 8/2007 Jung
2007/0202697 A1 8/2007 Jung
2007/0205438 A1 9/2007 Juengling
2007/0205443 A1 9/2007 Juengling
2007/0224537 A1 9/2007 Nozaki et al.
2007/0238053 A1 10/2007 Hashimoto
2007/0238299 A1 10/2007 Niroomand et al.
2007/0248916 A1 10/2007 Kamijima
2007/0261016 A1 11/2007 Sandhu et al.
2007/0264828 A1 11/2007 Jung et al.
2007/0264830 A1 11/2007 Huang et al.
2007/0278183 A1 12/2007 Lee et al.
2007/0281219 A1 12/2007 Sandhu
2007/0281488 A1 12/2007 Wells et al.
2007/0281493 A1 12/2007 Fucsko et al.
2008/0002475 A1 1/2008 Yang et al.
2008/0008969 A1 1/2008 Zhou et al.
2008/0026327 A1 1/2008 Koo
2008/0032243 A1 2/2008 Jung
2008/0032508 A1 2/2008 Chang
2008/0044770 A1 2/2008 Nozaki et al.
2008/0057692 A1 3/2008 Wells et al.
2008/0063986 A1 3/2008 Jung
2008/0064213 A1 3/2008 Jung
2008/0070165 A1 3/2008 Fischer et al.
2008/0076070 A1 3/2008 Koh et al.
2008/0085612 A1 4/2008 Smythe et al.
2008/0090416 A1 4/2008 Raghu et al.
2008/0113483 A1 5/2008 Wells
2008/0113511 A1 5/2008 Park et al.
2008/0122125 A1 5/2008 Zhou
2008/0171438 A1 7/2008 Sinha et al.
2008/0171446 A1 7/2008 Kim et al.
2008/0176152 A1 7/2008 Hah et al.
2008/0176406 A1 7/2008 Ikeda et al.
2008/0193658 A1 8/2008 Millward
2008/0199806 A1 8/2008 Hatakeyama et al.
2008/0199814 A1 8/2008 Brzozowy et al.
2008/0206950 A1 8/2008 Bhat et al.
2008/0120900 A1 9/2008 Wojtczak et al.
2008/0220600 A1 9/2008 Alapati et al.
2008/0254627 A1 10/2008 Wells
2008/0261349 A1 10/2008 Abatchev et al.
2008/0292991 A1 11/2008 Wallow et al.
2008/0296732 A1 12/2008 Olson
2008/0305636 A1 12/2008 Kim et al.
2009/0011374 A1 1/2009 Chang et al.
2009/0074958 A1 3/2009 Xiao
2009/0108415 A1 4/2009 Lenski et al.
2009/0117739 A1 5/2009 Shin et al.
2009/0130601 A1 5/2009 Jeon
2009/0130612 A1 5/2009 Yang
2009/0130852 A1 5/2009 Kewley
2009/0212016 A1 8/2009 Cheng et al.
2009/0214823 A1 8/2009 Cheng et al.
2009/0291397 A1 11/2009 deVilliers
2009/0298274 A1 12/2009 Kajiware
2010/0009512 A1 1/2010 Fishburn
2010/0021573 A1 1/2010 Gonzalez et al.
2010/0028809 A1 2/2010 Vanleenhove et al.
2010/0040980 A1 2/2010 Nishimura et al.
2010/0068656 A1 3/2010 Yeh et al.
2010/0081265 A1 4/2010 Mashita et al.
2010/0093175 A1 4/2010 Niroomand et al.
2010/0124826 A1 5/2010 Millward et al.
2010/0129980 A1 5/2010 Sandhu et al.
2010/0130015 A1 5/2010 Nakajima et al.
2010/0130016 A1 5/2010 deVilliers
2010/0144150 A1 6/2010 Sills et al.
2010/0144151 A1 6/2010 Sills et al.
2010/0144153 A1 6/2010 Sills et al.
2010/0203740 A1 8/2010 Li
2011/0018055 A1 1/2011 Ohta et al.
2011/0127677 A1 6/2011 Konishi
2011/0147984 A1 6/2011 Cheng et al.
2013/0009283 A1 1/2013 Zhou
2013/0078574 A1 3/2013 Peeters et al.

FOREIGN PATENT DOCUMENTS

CN 1761063 4/2006
CN 101026087 8/2007
CN 101145515 3/2008
CN 200980148546.9 11/2012
CN 200980148548.8 2/2013
CN 200980148590.X 2/2013
CN 201080013110.1 5/2013
EP 0171111 2/1996
EP 1273974 10/2003
EP 09830819 3/2013
EP 10756541 5/2013
EP 09743197 6/2013
EP 09830818.2 7/2013
EP 09830820 8/2013
EP 098308120 8/2013
JP 56046531 4/1981
JP 58157135 9/1983
JP 59211231 11/1984
JP 64035916 7/1989
JP 1-292829 11/1989
JP 3270227 12/1991
JP 06-077180 3/1994
JP 6275577 A 9/1994
JP 2002-217170 8/2002
JP 2003234279 8/2003
JP 2004134574 A 4/2004
JP 2004247399 9/2004
JP 2005-243681 9/2005
JP 2006245625 9/2006
JP 2007017993 1/2007
JP 2007294511 11/2007
JP 2007305976 11/2007
JP 2008-072097 3/2008
JP 2008-072101 3/2008
JP 2009289974 12/2009
KR 20030049198 6/2003
KR 20030056601 7/2003
KR 20030089063 11/2003
KR 10-2004-0016678 2/2004
KR 4025289 3/2004
KR 20040057582 7/2004
KR 10-2007-0076793 7/2007
KR 10-2007-0122049 12/2007
KR 10-0784062 12/2007
KR 10-2008-0024053 3/2008
KR 10-2008-0039006 5/2008
KR 20080038963 A 5/2008
SG 201300653-7 6/2013
SG 201300853-7 6/2013

(56) References Cited

FOREIGN PATENT DOCUMENTS

TW 200702903 1/2007
TW 200818405 4/2008
TW 200834660 8/2008
TW 098113229 9/2012
TW 098139941 12/2012
TW 098139943 12/2012
TW 099140232 7/2013
TW 098139942 12/2013
WO WO 2006/104654 10/2006
WO WO2007/027558 3/2007
WO WO 2008/008338 1/2008
WO WO PCT/US2007/015729 1/2008
WO WO 2008/059440 5/2008
WO WO PCT/US2009/039793 10/2009
WO WO PCT/US2009/041500 12/2009
WO WO PCT/US2009/063978 5/2010
WO WO PCT/US2009/063999 5/2010
WO WO PCT/US2009/064004 5/2010
WO WO PCT/US2010/025495 9/2010
WO WO PCT/US2009/039793 11/2010
WO WO PCT/US2009/041500 12/2010
WO WO PCT/US2009/063978 6/2011
WO WO PCT/US2009/063999 6/2011
WO WO PCT/US2009/064004 6/2011
WO WO PCT/US2010/055488 6/2011
WO WO PCT/US2010/025495 9/2011
WO WO PCT/US2010/055488 6/2012

OTHER PUBLICATIONS

U.S. Appl. No. 13/101,485, filed May 5, 2011, Light et al.

Clariant, Polysilazane SODs Spinful 400 Series for STI/PMD Application; Oct. 19, 2009; 1 pp.

Ee et al., "Innovative Solutions to Enhance the Legacy Equipments Towards One Generation Ahead in Flip Chip BGA 0.8mm Ball Pitch Technology", Sep. 2005; 4 pp.

Fritze et al., "Enhanced Resosulation for Future Fabrication", Jan. 2003, 5 pp.

Gallia et al., "A Flexible Gate Array Architecture for High-speed and High-Density Applications", Mar. 1996, pp. 430-436.

Hori et al., "Sub-40nm Half-Pitch Double Patterning with Resist Freezing Process", 2008 8 pp.

Lee et al., "Double-Patterning Technique Using Plasma Treatment of Photoresist", Sep. 20, 2007, 5 pp.

Liau et al., "Softbake and Post-exposure Bake Optimization for Process Window Improvement and Optical Proximity Effect Tuning", 2006, 7 pp.

Lu "Advanced Cell Structuresw for Dynamic RAMs", Jan. 1989, pp. 27-36.

Ma, "Plasma Resist Image Stabilization Technique (PRIST)", 1980, 2 pp.

Owa et al., "Immersion Lithography Ready for 45nm Manufacturing and Beyond", 2007, pp. 238-244.

Pease et al., "Lithography and Other Patterning Techniques for Future Electronics", Feb. 2008, pp. 246-270.

Tan et al., "Current Status of Nanonex Nanoimprint Solutions", 2004, 9 pp.

Terai et al., "Newly developed RELACS Process and materials for 64 nm node device and beyond", pp. 20-21.

Toyoshima et al.; 0.1 μm Level Contact Hole Pattern Formation with KrF Lithography by Resolution Enhancement Lithography Assisted by Chemical Shrink (RELACS); IEEE; 1998; pp. 12.5.1-12.5.4.

* cited by examiner 20
20
20
18
17
17
24
22
26
24
22
24
12
22
12
12
18

10
20
20
20
26
18
12
18
22
16
14
16

10
26
22
16
24
24
24
14

10b

METHODS OF FORMING A PATTERN ON A SUBSTRATE

RELATED PATENT DATA

This patent resulted from a continuation of U.S. patent application Ser. No. 13/101,485, filed May 5, 2011, entitled "Methods of Forming a Pattern on a Substrate" naming Scott L. Light and Anton J. deVilliers as inventors, the disclosure of which is incorporated by reference.

TECHNICAL FIELD

Embodiments disclosed herein pertain to methods of forming patterns over substrates, for example to forming a plurality of contact openings to node locations in the fabrication of integrated circuitry.

BACKGROUND

Integrated circuits are often formed on a semiconductor substrate such as a silicon wafer or other semiconductive material. In general, layers of various materials which are semiconductive, conductive, or electrically insulative are utilized to form the integrated circuits. By way of examples, the various materials may be doped, ion implanted, deposited, etched, grown, etc. using various processes. A continuing goal in semiconductive processing is to strive to reduce the size of individual electronic components, thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized. Further, patterns may be formed on substrates without using photoresist.

The continual reduction in feature sizes places ever greater demands on the techniques used to form the features. For example, photolithography is commonly used to form patterned features, such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed are uniform in dimension. Accordingly, uniformity when forming a plurality of features may also be of concern, and is increasingly a challenge as the minimum feature dimensions reduce.

DETAILED DESCRIPTION OF EXAMPLE EMBODIMENTS

Figure 1:
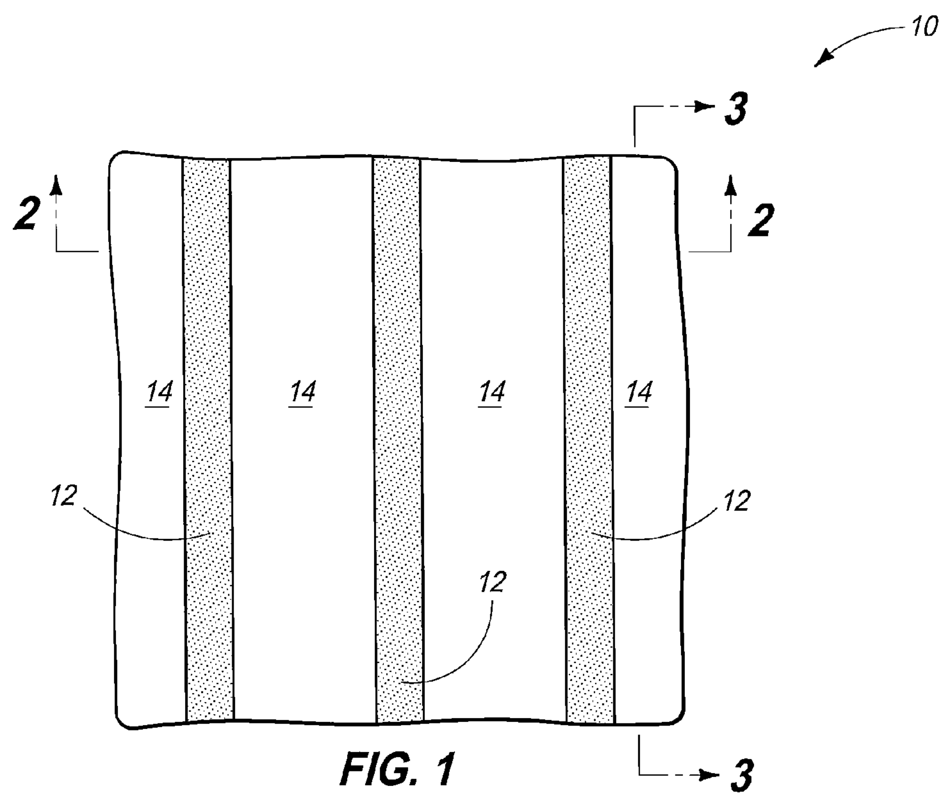
FIG. 1 is a diagrammatic top view of a substrate in process in accordance with an embodiment of the invention.
Figure 2:
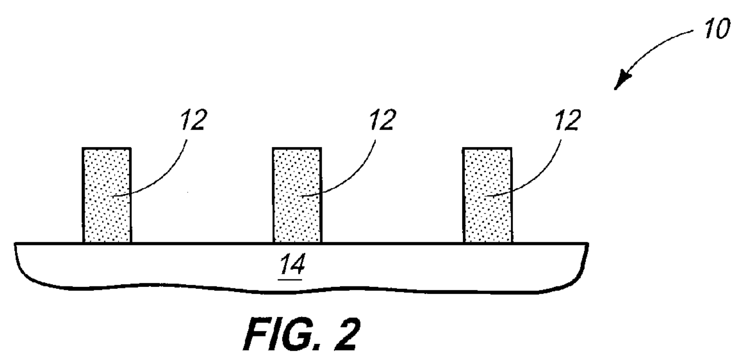
FIG. 2 is a cross sectional view taken through line 2-2 in FIG. 1.
Figure 3:
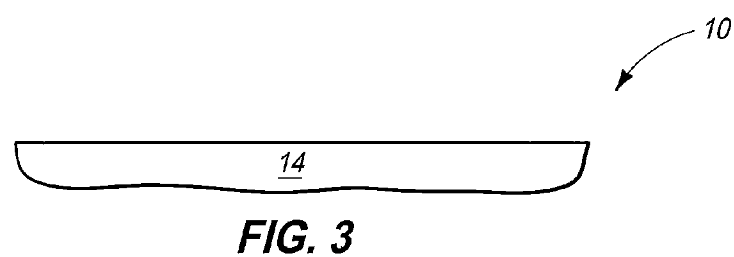
FIG. 3 is a cross sectional view taken through line 3-3 in FIG. 1.

Initial example methods of forming a pattern on a substrate are described with reference to FIGS. 1-30 with respect to a substrate fragment 10. Referring to FIGS. 1-3, longitudinally elongated first lines 12 have been formed over an underlying substrate 14. First lines 12 may be homogenous or non-homogenous, may remain or be removed at the finish of processing, and may comprise any material, whether conductive, insulative, and/or semiconductive. Such may respectively have constant lateral width or variable width, and such may be of the same or different width, sizes and shapes relative one another. Further and regardless, such may be fabricated at, above, or below minimum photolithographic feature width where photolithography may be used during fabrication. One example material for first lines 12 is photoresist.

Underlying substrate 14 may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias therein which extend vertically or otherwise into current conductive electrical connection with electronic device components, regions, or material received elevationally inward of the dielectric material. Underlying substrate 14 may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In but one example only, the description proceeds relative to fabrication of a feature pattern on a substrate having a final feature width of about the minimum lateral width of features 12. An example pitch doubling process may be used whereby space between immediately adjacent lines 12 is approximately three times the width of features 12. Regardless, first lines 12 may be or may have been subjected to a lateral trimming etch. Further and regardless, features 12 may have resulted from a pattern transfer from an overlying layer, followed by removal thereof.

Figure 4:
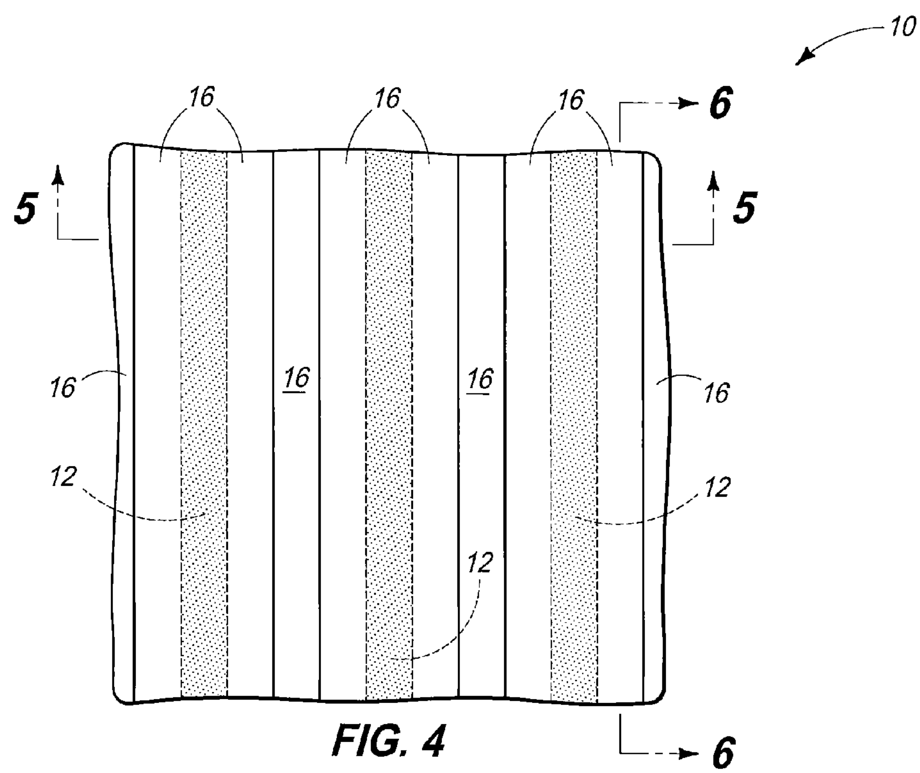
FIG. 4 is a view of the FIG. 1 substrate at a processing step subsequent to that shown by FIG. 1.
Figure 5:
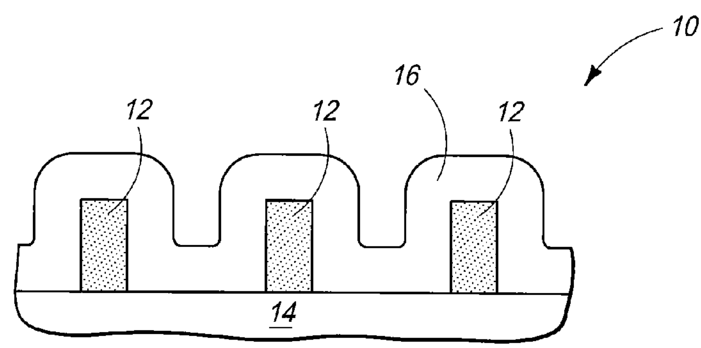
FIG. 5 is a cross sectional view taken through line 5-5 in FIG. 4.
Figure 6:
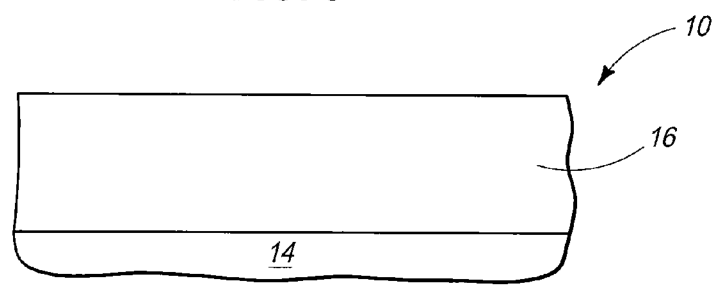
FIG. 6 is a cross sectional view taken through line 6-6 in FIG. 4.

Referring to FIGS. 4-6, a spacer-forming layer 16 has been formed over first lines 12. Such may be homogenous or non-homogenous, may be sacrificial, and may be formed by any suitable deposition technique. An example ideal technique is atomic layer deposition, and example compositions include silicon dioxide and silicon nitride. In the depicted example, spacer-forming layer 16 has been deposited to a thickness about equal to the lateral width of first lines 12.

Figure 7:
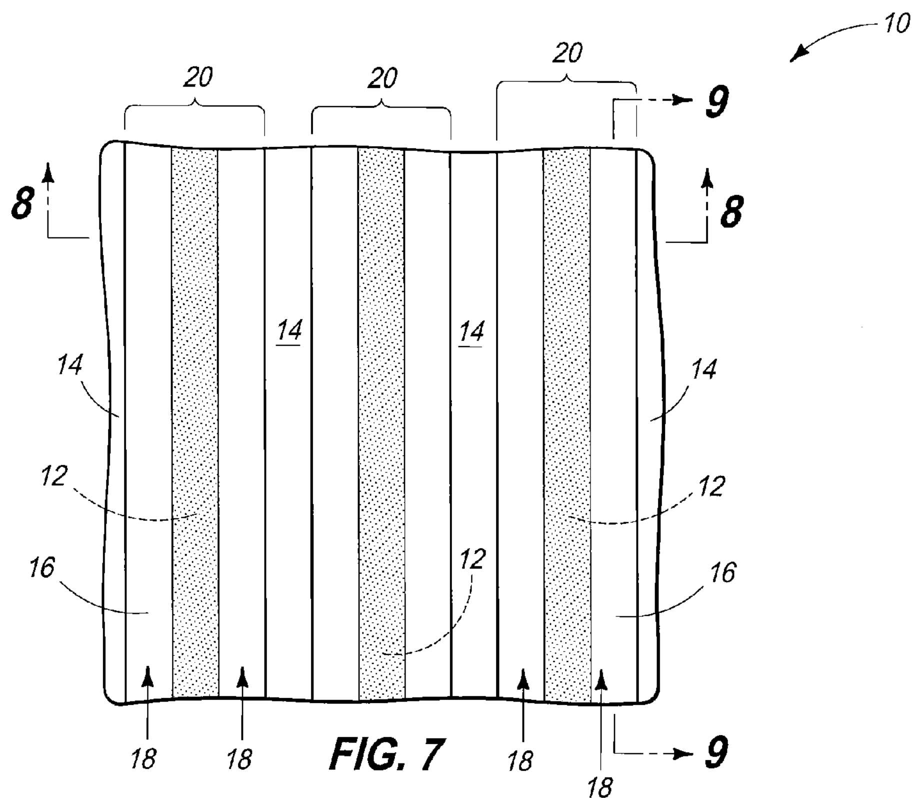
FIG. 7 is a view of the FIG. 4 substrate at a processing step subsequent to that shown by FIG. 4.
Figure 8:
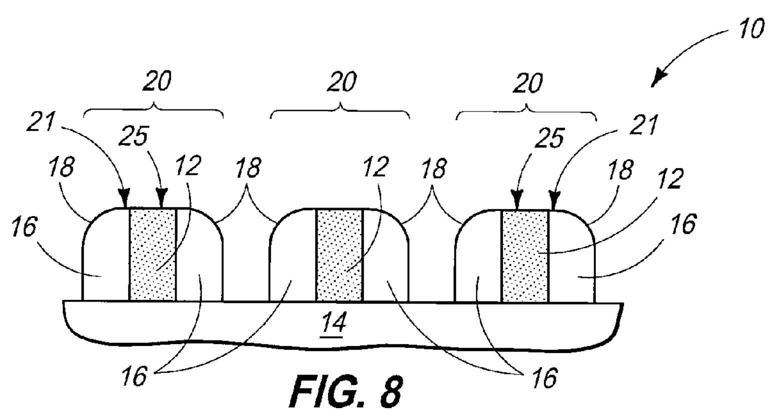
FIG. 8 is a cross sectional view taken through line 8-8 in FIG. 7.
Figure 9:
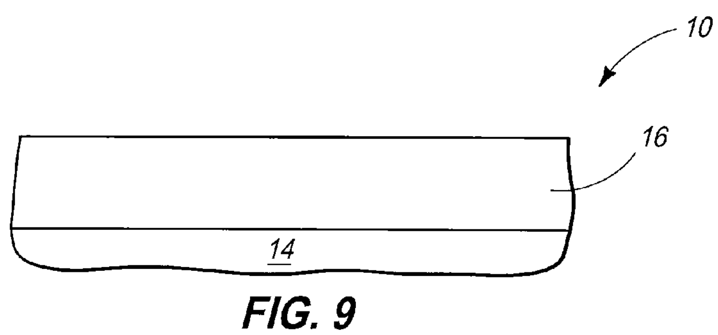
FIG. 9 is a cross sectional view taken through line 9-9 in FIG. 7.

Referring to FIGS. 7-9, spacer-forming layer 16 has been subjected to an anisotropic etch, thereby forming first sidewall spacers 18 which are received longitudinally along opposite sides of first lines 12. Such may be formed by masked and/or mask-less manner(s). Example first features 20 are thereby formed elevationally over an underlying substrate, with such first features comprising longitudinally elongated first lines having first sidewall spacers (i.e., material extending or originally formed extending from sidewalls of another material) received longitudinally along opposite sides thereof. Any alternate existing or yet-to-be-developed technique(s) may be used to form first features 20. Elevationally outermost surfaces 21 of the respective first sidewall spacers may be elevationally coincident. Elevationally outermost surfaces 25 of the respective first lines may be elevationally coincident. If the outermost surfaces of the first sidewall spacers and the first lines are respectively elevationally coincident, such may further be elevationally coincident relative each other.

Figure 10:
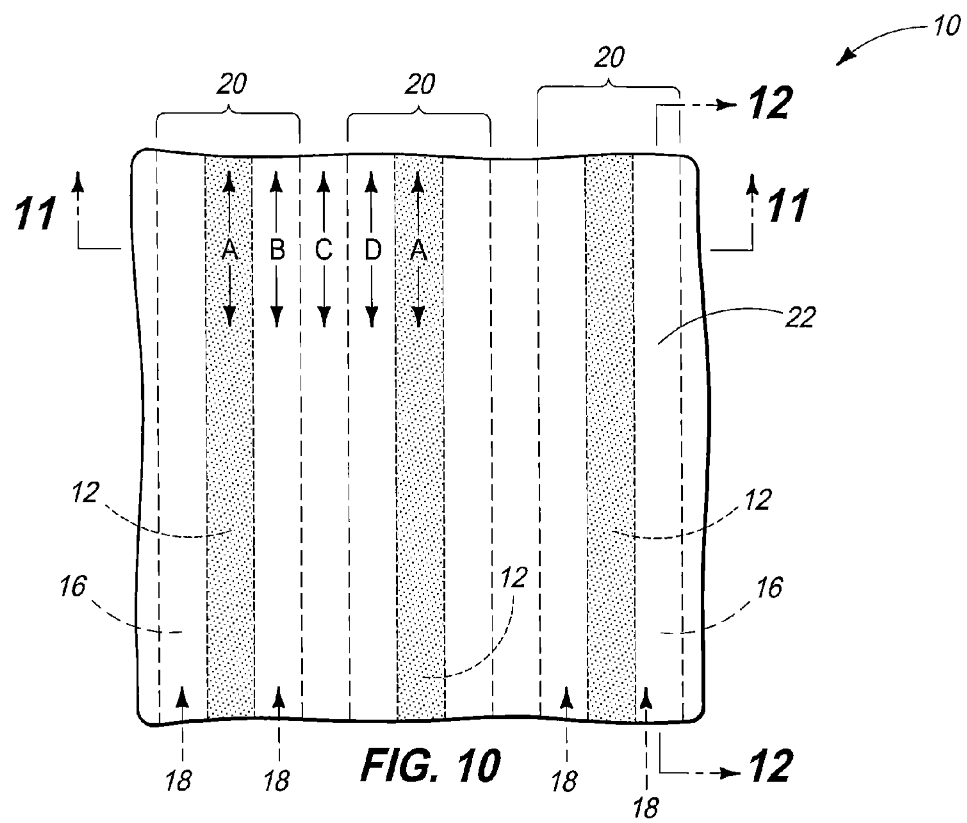
FIG. 10 is a view of the FIG. 7 substrate at a processing step subsequent to that shown by FIG. 7.
Figure 11:
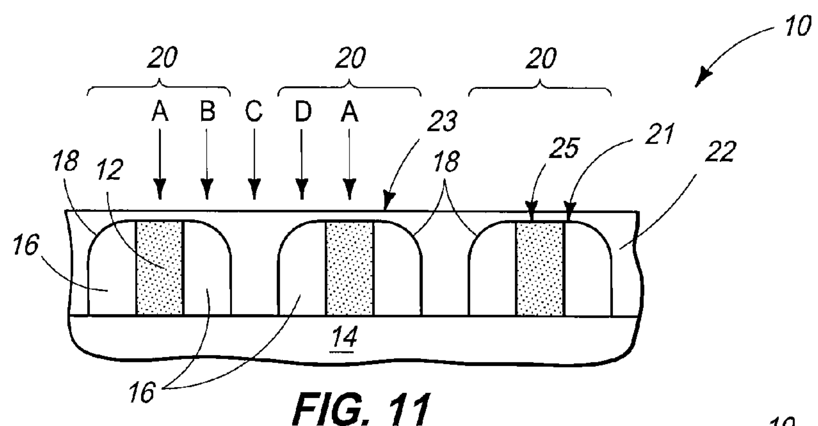
FIG. 11 is a cross sectional view taken through line 11-11 in FIG. 10.
Figure 12:
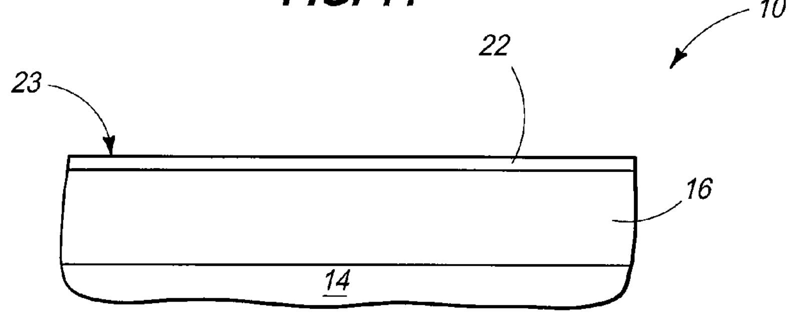
FIG. 12 is a cross sectional view taken through line 12-12 in FIG. 10.

Referring to FIGS. 10-12, first fill material 22 has been formed to be received laterally between first sidewall spacers 18 of laterally adjacent first features 20. Such may be homogenous or non-homogenous, and may be of the same composition as the material of first lines 12. Such may be organic and/or inorganic, and be deposited by any technique including liquid spin-on techniques which may inherently result in a planar elevationally outermost surface 23. By way of examples only, some suitable materials include photoresist, spin-on materials, and antireflective coatings such as DARC and BARC. The outermost surface of first fill material 22 may or may not be planar, and may be formed to be elevationally coincident with, elevationally outward of, or inwardly of outermost surfaces 21, 25 of first spacers 18 and/or first lines 12. FIGS. 10-12 depict an example wherein outermost surface 23 of first fill material 22 is elevationally outward of such surfaces of first spacers 18 and such surfaces of first lines 12.

Figure 13:
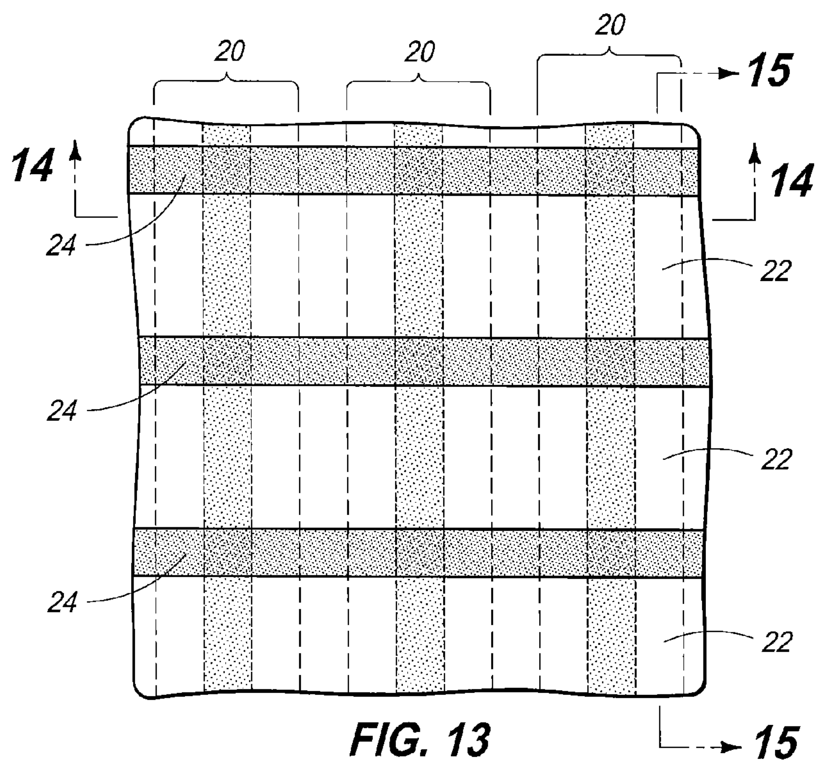
FIG. 13 is a view of the FIG. 10 substrate at a processing step subsequent to that shown by FIG. 10.
Figure 14:
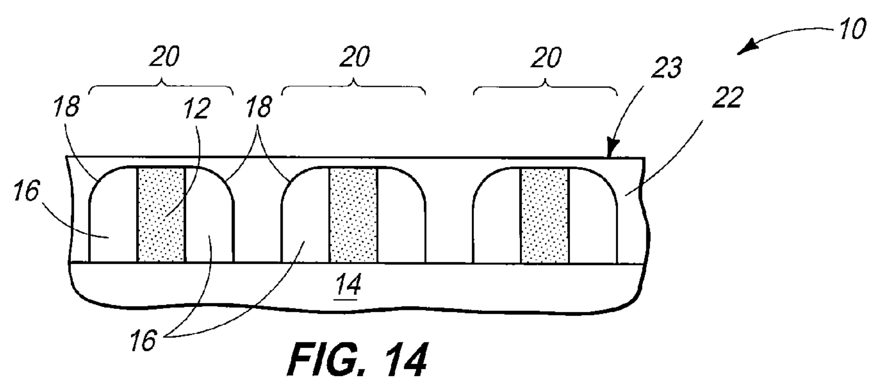
FIG. 14 is a cross sectional view taken through line 14-14 in FIG. 13.
Figure 15:
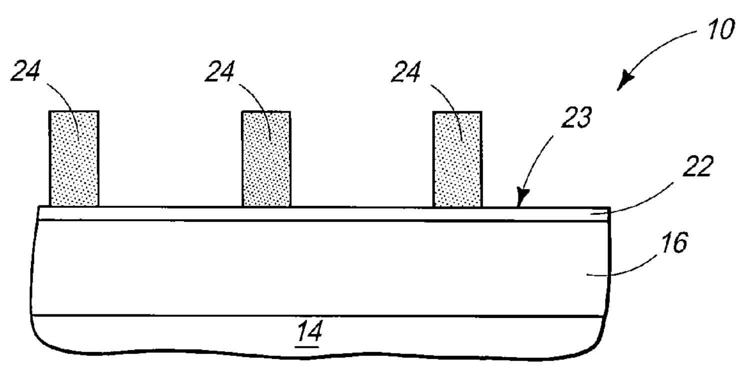
FIG. 15 is a cross sectional view taken through line 15-15 in FIG. 13.

Referring to FIGS. 13-15, longitudinally elongated second lines 24 have been formed elevationally over first fill material 22. Such may be of the same or different composition(s) as first lines 12, and formed by any of the same or different techniques as described above. In accordance with the example particular pitch-doubling process shown, such have been formed to have a maximum lateral width equal to about the final feature width, with immediately adjacent second lines 24 being separated by spaces having about three times such final feature width. Alternate sizes may be used, and the size and spacing of the first and second lines may not be the same (not shown).

Figures 16, 17, 18:
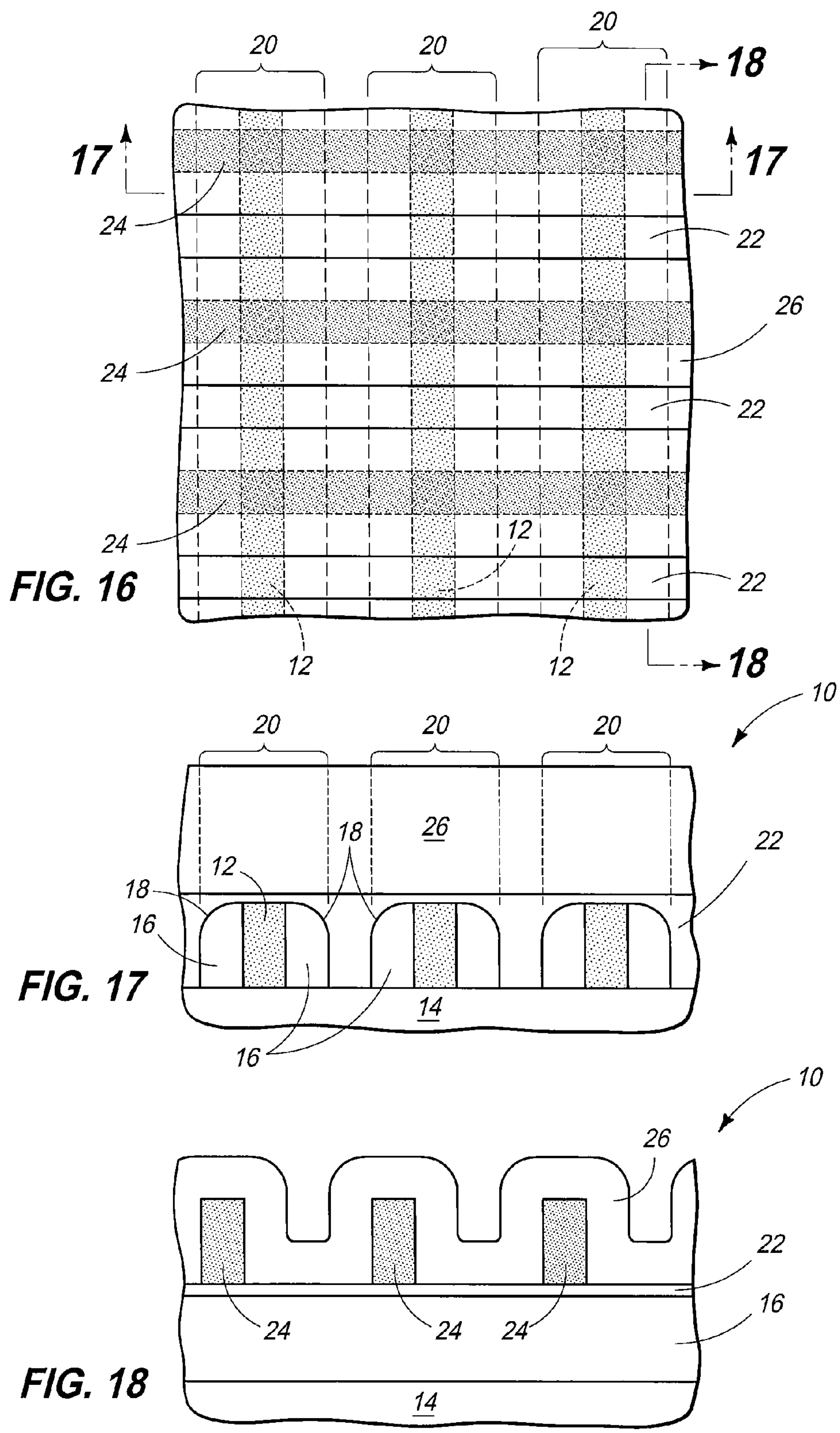
FIG. 16 is a view of the FIG. 13 substrate at a processing step subsequent to that shown by FIG. 13.
FIG. 17 is a cross sectional view taken through line 17-17 in FIG. 16.
FIG. 18 is a cross sectional view taken through line 18-18 in FIG. 16.

Referring to FIGS. 16-18, another spacer-forming layer 26 has been formed over second lines 24. Such may be of the same or different composition(s) as material of first spacers 18. Such is shown as having been deposited to about the minimum final feature width, although other thicknesses may be used.

Figure 19:
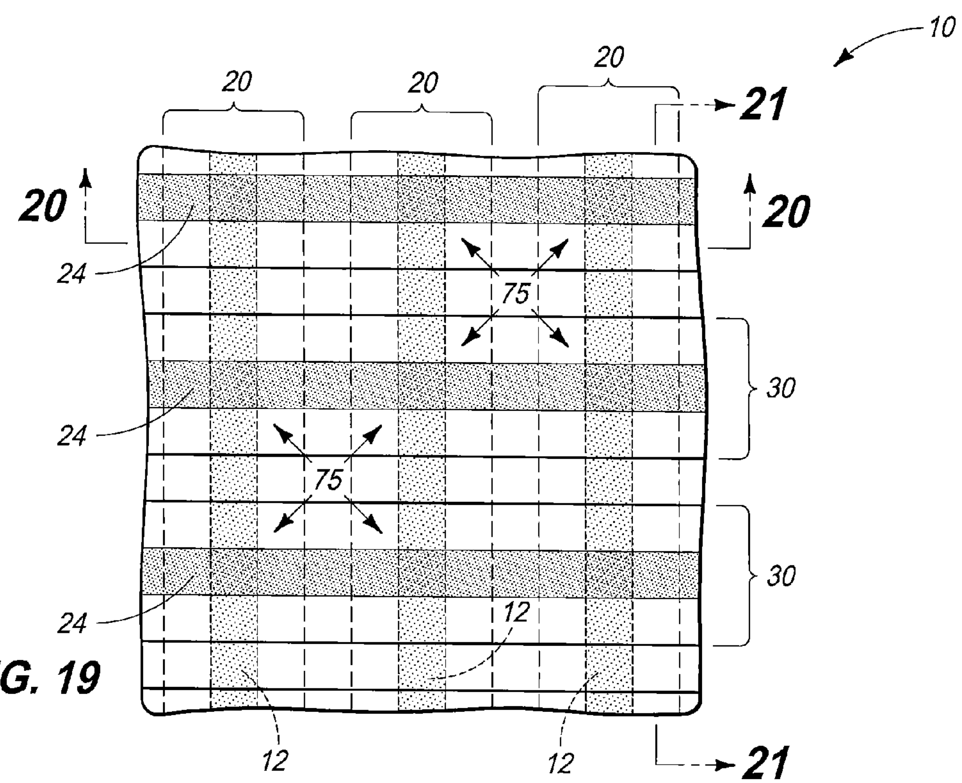
FIG. 19 is a view of the FIG. 16 substrate at a processing step subsequent to that shown by FIG. 16.
Figure 20:
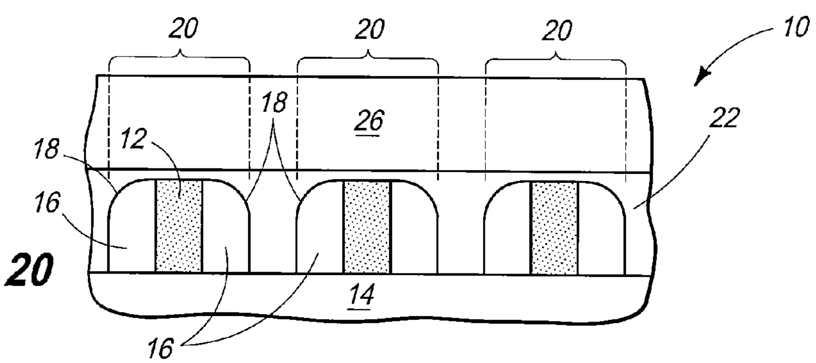
FIG. 20 is a cross sectional view taken through line 20-20 in FIG. 19.
Figure 21:
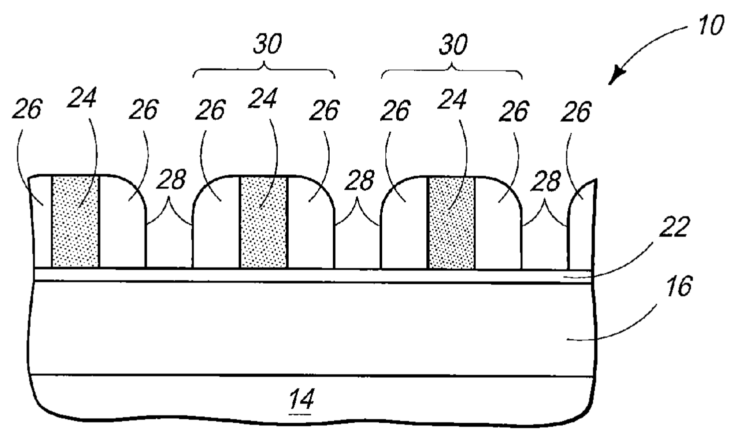
FIG. 21 is a cross sectional view taken through line 21-21 in FIG. 19.

Referring to FIGS. 19-21, spacer-forming layer 26 has been anisotropically etched to form second sidewall spacers 28 which are received longitudinally along opposite sides of second lines 24. Such may be conducted in masked and/or mask-less manner(s). Regardless, second features 30 have been formed elevationally over and crossing first features 20, with second features 30 comprising second lines 24 having sidewall spacers 28 received longitudinally along opposite sides thereof. In one embodiment and as shown, first features 20 and second features 30 cross orthogonally relative one another, although such may cross non-orthogonally. Further in the depicted example, first features 20 and second features 30 each extend longitudinally straight linear. Alternately by way of examples only, one or both of the collective first features and the collective second features may not be straight linear or respectively extend longitudinally curvilinear (not shown) regardless of whether crossing orthogonally relative one another.

Figure 22:
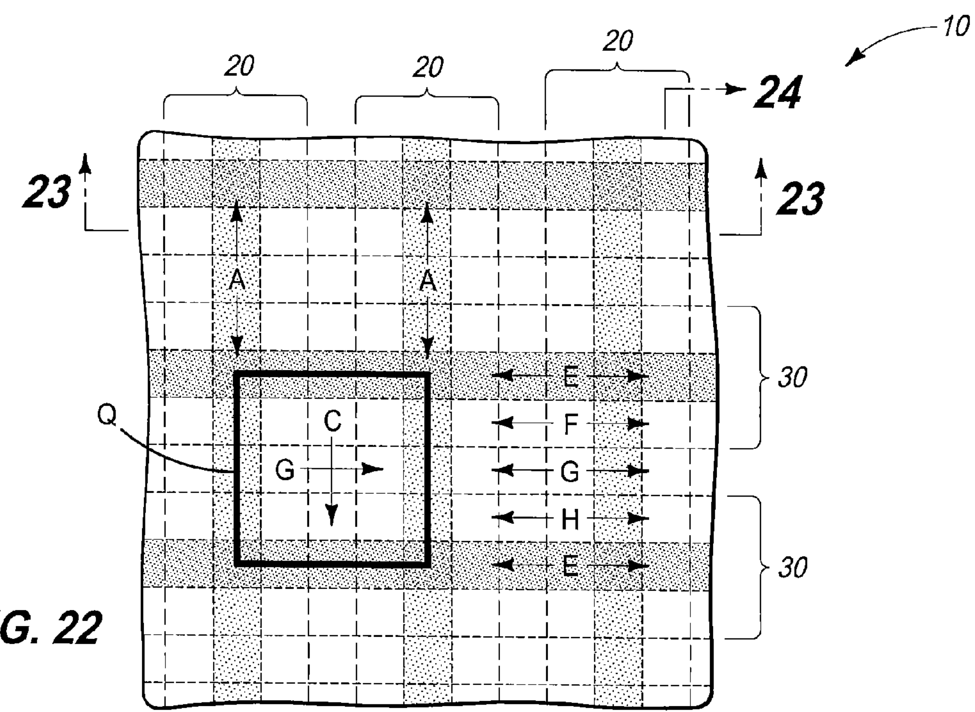
FIG. 22 is a view of the FIG. 19 substrate at a processing step subsequent to that shown by FIG. 19.
Figure 23:
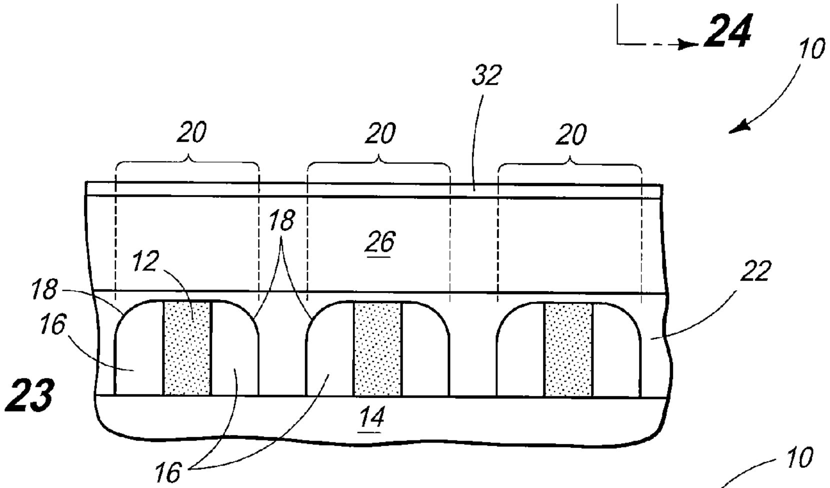
FIG. 23 is a cross sectional view taken through line 23-23 in FIG. 22.
Figure 24:
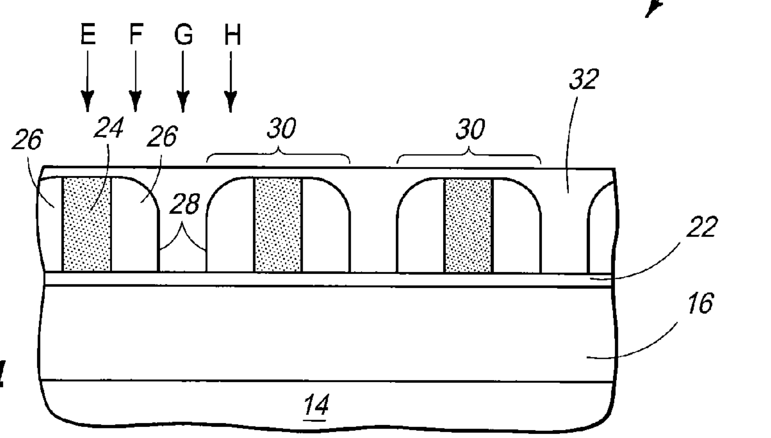
FIG. 24 is a cross sectional view taken through line 24-24 in FIG. 22.

Referring to FIGS. 22-24, second fill material 32 is provided to be received laterally between second sidewall spacers 28 of laterally adjacent second features 30. Such may be of the same or different composition(s) as first fill material 22. Further, such may have any of the same attributes described above with respect to first fill material 22, including by way of example only those with respect to the second spacers and second lines as the first fill material may have with respect to the first spacers and first lines.

Figure 25:
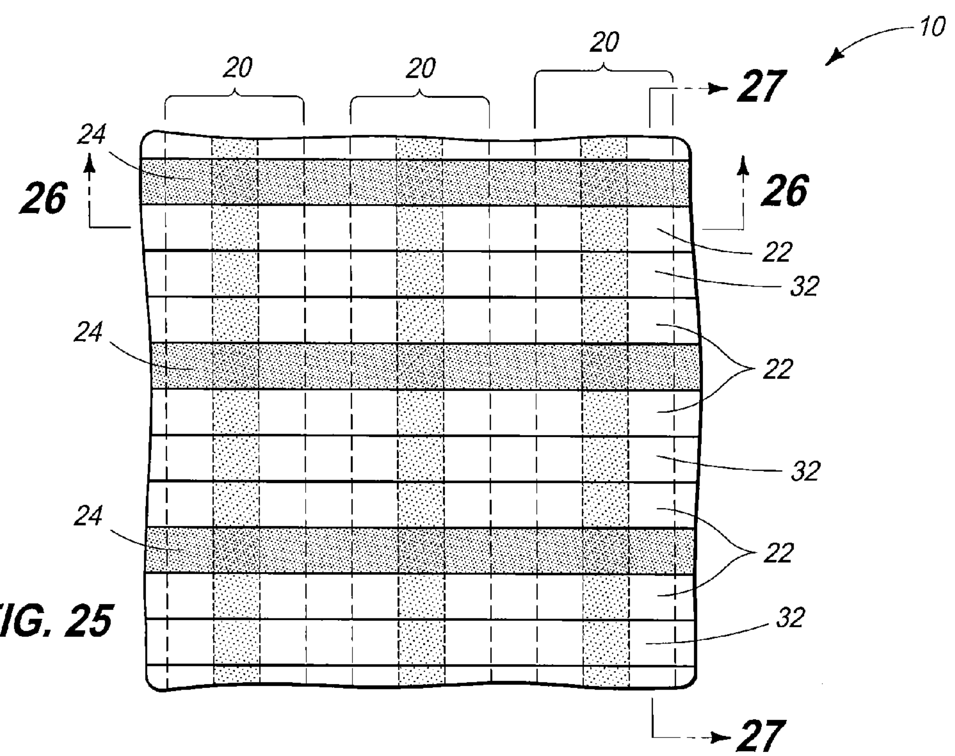
FIG. 25 is a view of the FIG. 22 substrate at a processing step subsequent to that shown by FIG. 22.
Figure 26:
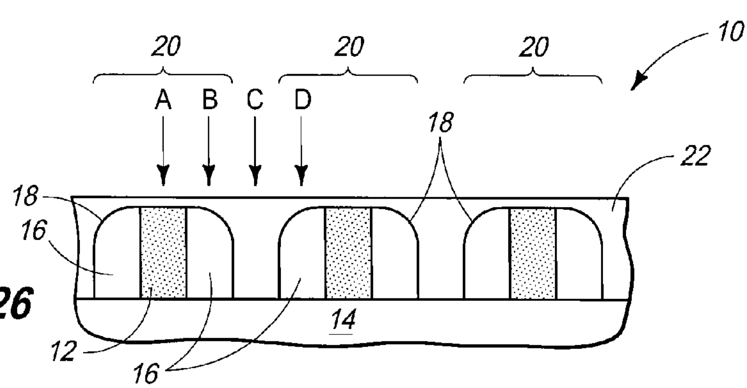
FIG. 26 is a cross sectional view taken through line 26-26 in FIG. 25.
Figure 27:
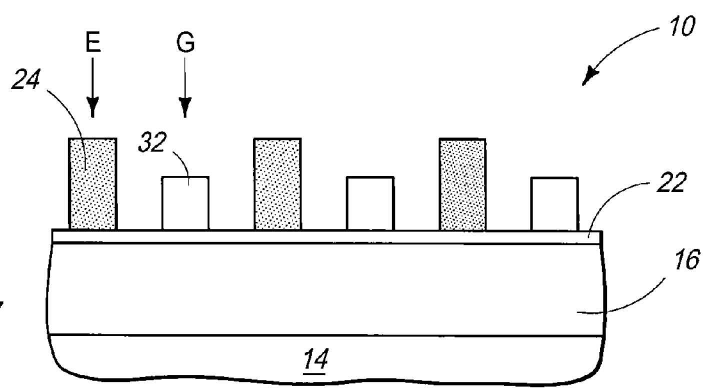
FIG. 27 is a cross sectional view taken through line 27-27 in FIG. 25.

Referring to FIGS. 25-27, second fill material 32 has been removed sufficiently to at least expose elevationally outermost surfaces of second sidewall spacers 28 (not shown), with such spacers thereafter having been removed. The act of removing the second sidewall spacers may or may not expose underlying first sidewall spacers 18, with such not being exposed in FIGS. 25 and 26 due to first fill material 22 being received thereover. Ideally, removal of the second sidewall spacers from between the second lines and the second fill material is conducted by a selective anisotropic etch. In the context of this document, a "selective etch" denotes removal of one material relative to another at a removal rate of at least 1.5:1.

Figure 28:
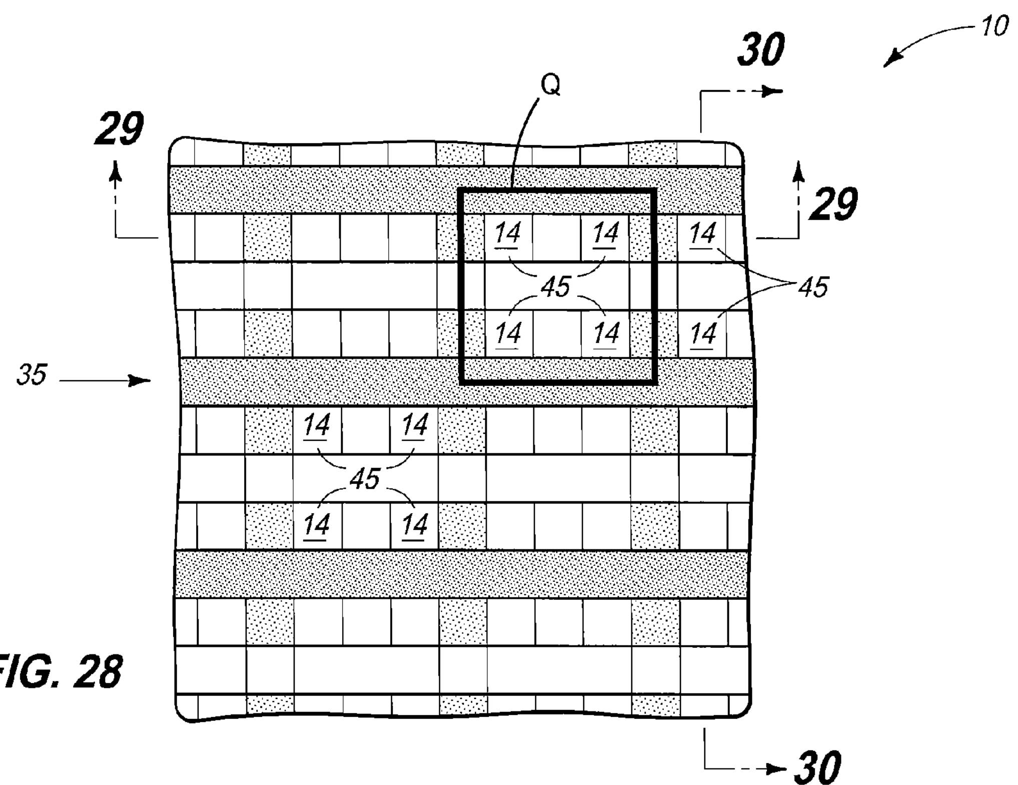
FIG. 28 is a view of the FIG. 25 substrate at a processing step subsequent to that shown by FIG. 25.
Figure 29:
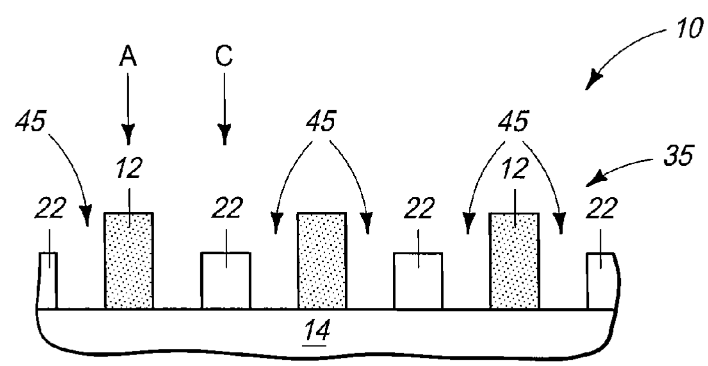
FIG. 29 is a cross sectional view taken through line 29-29 in FIG. 28.
Figure 30:
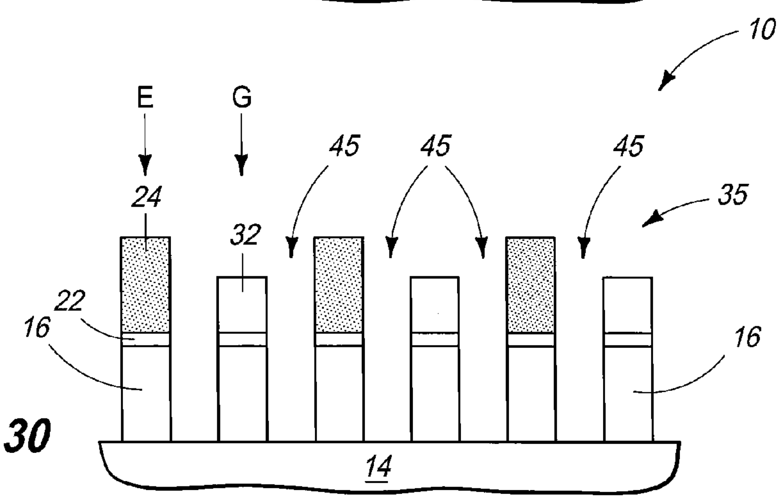
FIG. 30 is a cross sectional view taken through line 30-30 in FIG. 28.

Referring to FIGS. 28-30, first fill material 22 has been removed at least where covering underlying first sidewall spacers 18 and first lines 12. Subsequently, portions of first sidewall spacers 18 (not shown) have been removed from between first lines 12 and first fill material 22 that are not covered by second lines 24 and second fill material 32. Such may be conducted ideally by a selective anisotropic etch relative to the first lines, the first fill material, the second lines, and the second fill material. Regardless, FIGS. 28-30 show an example pattern 35 comprising a plurality of openings 45.

Figure 31:
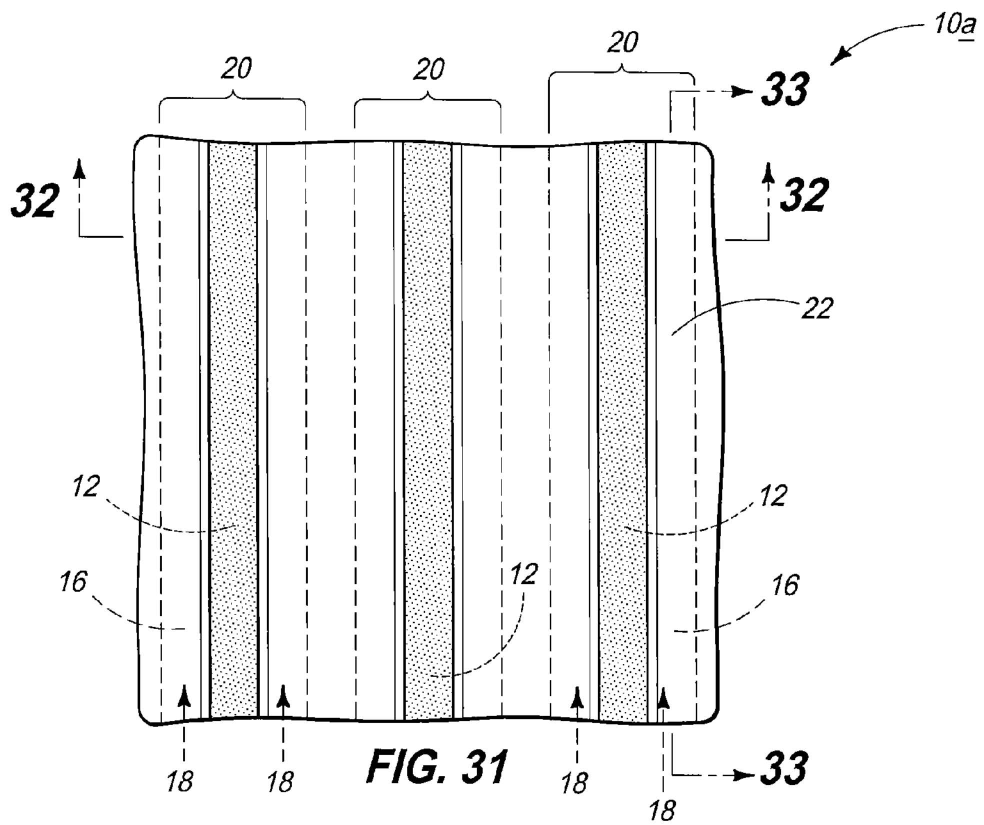
FIG. 31 is a diagrammatic top view of a substrate in process in accordance with an embodiment of the invention.
Figure 32:
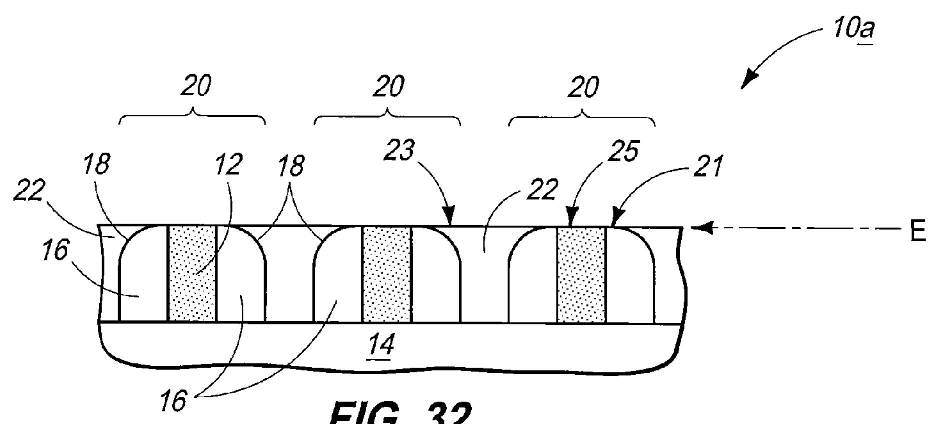
FIG. 32 is a cross sectional view taken through line 32-32 in FIG. 31.
Figure 33:
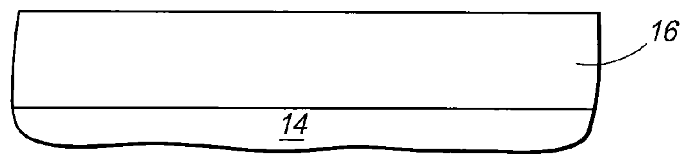
FIG. 33 is a cross sectional view taken through line 33-33 in FIG. 31.

In the above-depicted embodiment, first fill material 22 was formed to have an elevationally outer surface that was elevationally outward of elevationally outermost surfaces 21 of first sidewall spacers 18 (see FIGS. 10-12). An alternate example is shown in FIGS. 31-33 with respect to a substrate fragment **10*a*. Like numerals from the above-described embodiment have been used. FIGS. 31-33 show first fill material 22 as having been formed to have its elevationally outermost surface 23 to be elevationally coincident with elevationally outermost surfaces 21 of first sidewall spacers 18 (FIG. 32). Additionally, surface 23 is elevationally coincident with first line outer surfaces 25. Further, outermost surfaces 21 of first sidewall spacers 18 are at a common elevation "E", with elevationally outermost surface 23 of first fill material 22 being planar and elevationally coincident with outermost surfaces 21 of first sidewall spacers 18**.

Figure 34:
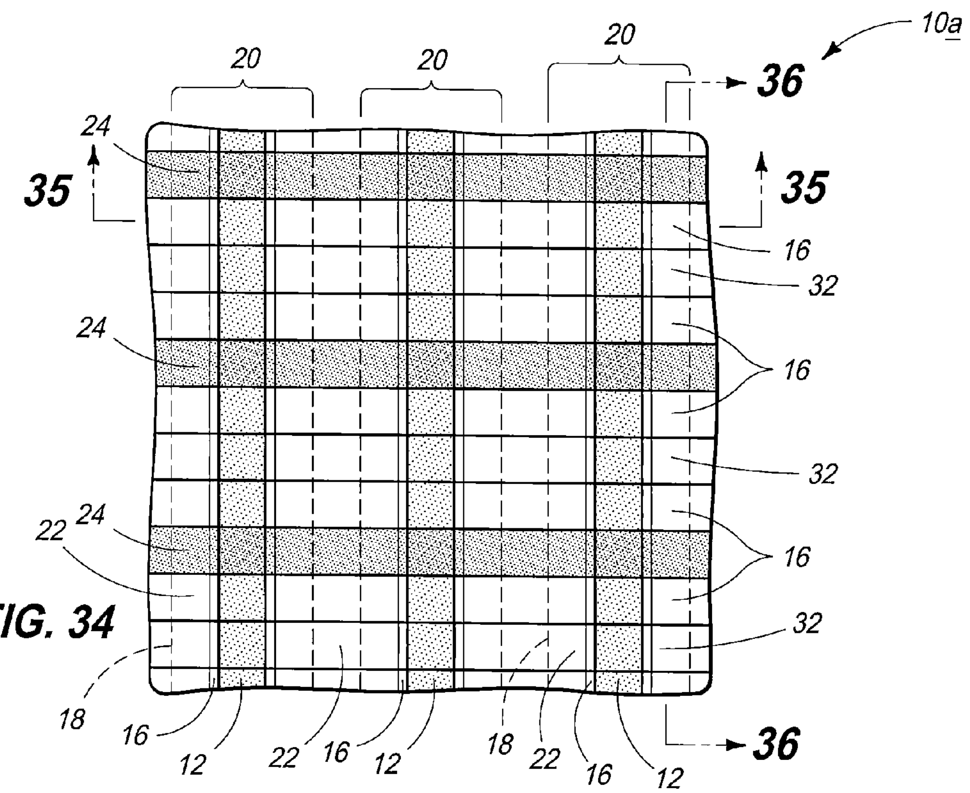
FIG. 34 is a view of the FIG. 31 substrate at a processing step subsequent to that shown by FIG. 31.
Figure 35:
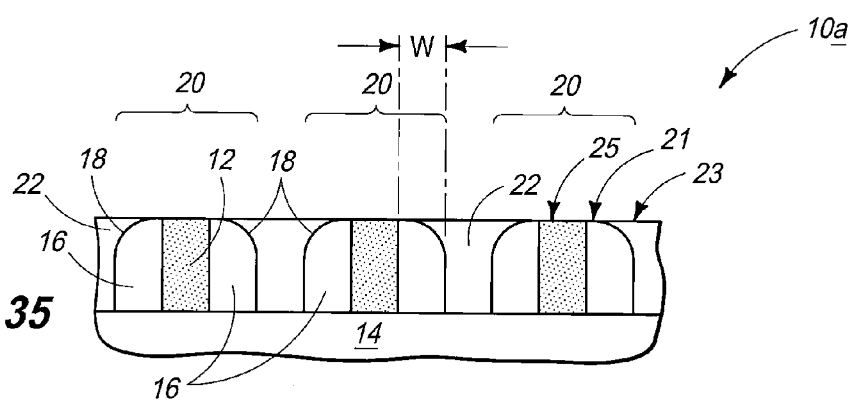
FIG. 35 is a cross sectional view taken through line 35-35 in FIG. 34.
Figure 36:
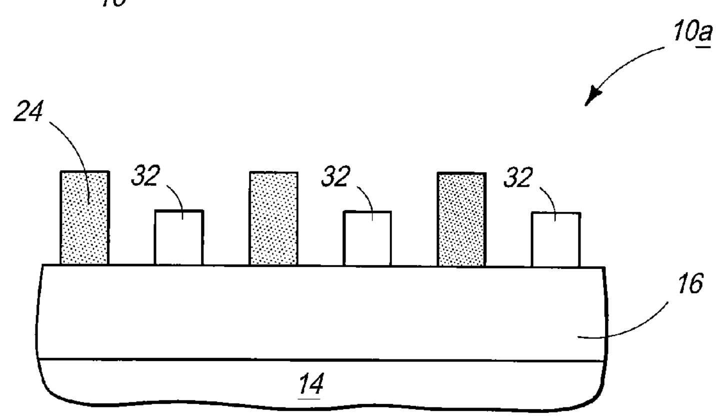
FIG. 36 is a cross sectional view taken through line 36-36 in FIG. 34.

FIGS. 34-36 correspond in processing sequence to FIGS. 25-27 of the first-described embodiments. Second sidewall spacers 28 (not shown) have been removed from between second lines 24 and second fill material 32 whereby underlying portions of first sidewall spacers 18 have been exposed. Such removal has exposed only some of the lateral width "W" of respective first sidewall spacers 18 due to, for example, the depicted upper surfaces of first spacers 18 curving or tapering laterally outward and elevationally inward.

Figure 37:
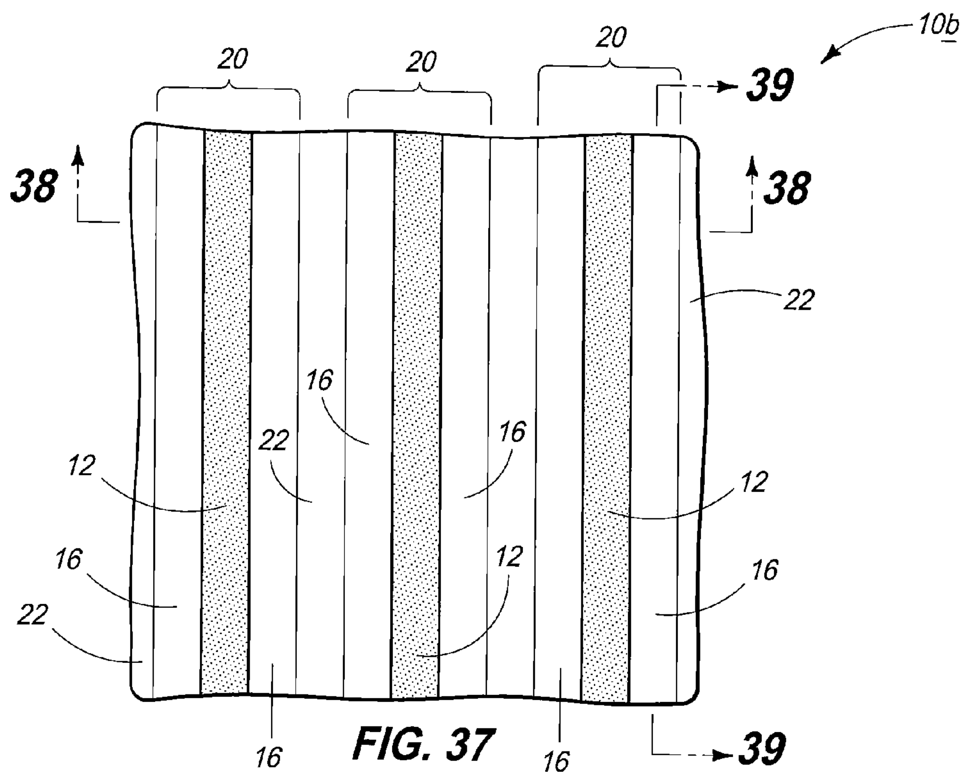
FIG. 37 is a diagrammatic top view of a substrate in process in accordance with an embodiment of the invention.
Figure 38:
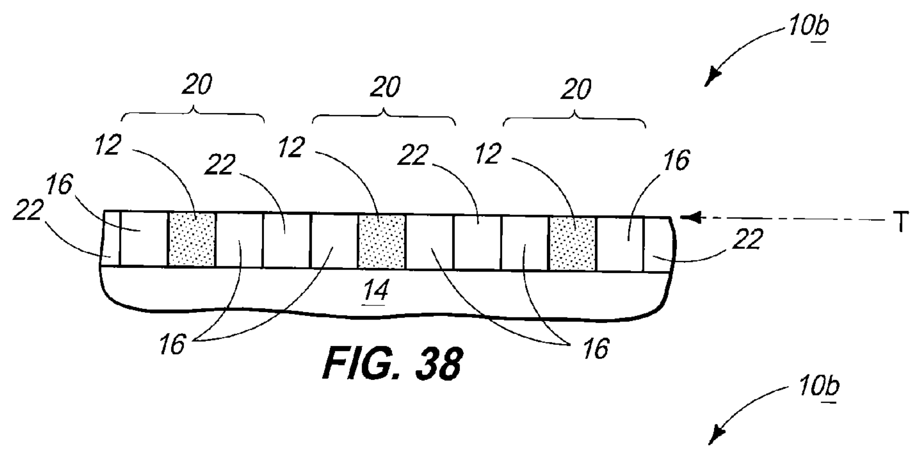
FIG. 38 is a cross sectional view taken through line 38-38 in FIG. 37.
Figure 39:
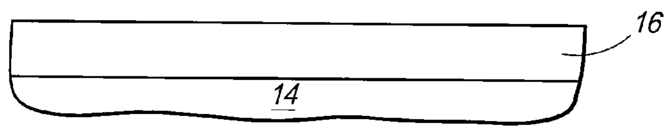
FIG. 39 is a cross sectional view taken through line 39-39 in FIG. 37.

Another and/or alternate example embodiment is described with reference to a substrate fragment **10*b* with reference to FIGS. 37-39. Like numerals from the above-described embodiments have been used. FIGS. 37-39 correspond in processing sequence as would occur immediately subsequent to that of FIGS. 10-12 or FIGS. 31-32 in the above-described embodiments. Specifically with respect to the substrate of FIGS. 10-12, first lines 12, first sidewall spacers 18, and first fill material 22 have been planarized elevationally inward to a co-planar elevationally outermost surface T. Processing may occur subsequently in any of the manners described above. Further if, for example, the second sidewall spacers are subsequently formed directly against first spacers 18, removal thereof may inherently expose portions of first sidewall spacers 18**. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another.

Figure 40:
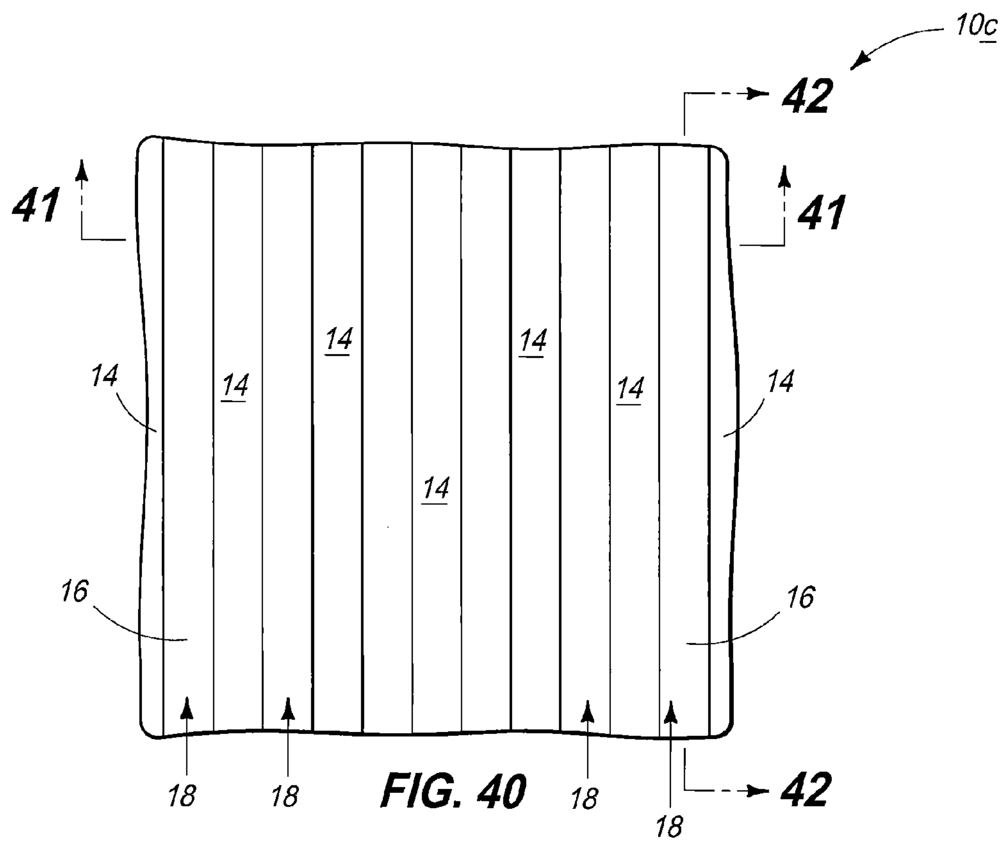
FIG. 40 is a diagrammatic top view of a substrate in process in accordance with an embodiment of the invention.
Figure 41:
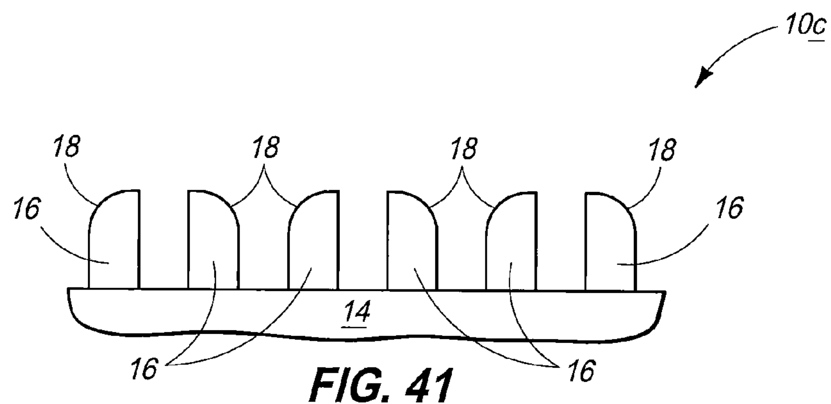
FIG. 41 is a cross sectional view taken through line 41-41 in FIG. 40.
Figure 42:
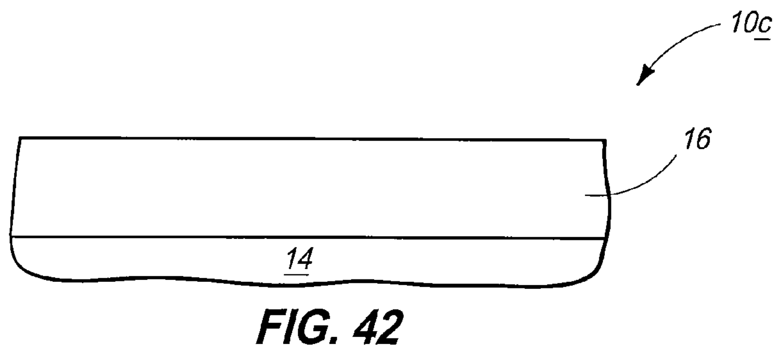
FIG. 42 is a cross sectional view taken through line 42-42 in FIG. 40.

Another example embodiment of a method of forming a pattern on a substrate is described with reference to FIGS. 40-45 with respect to a substrate fragment 10*c*. Like numerals from the above-described embodiments have been used. In the above embodiments at the processing of FIGS. 10-12 and 31-33, original first lines 12 remain prior to deposition of first fill material 22. However as another example, some or all of such original line material may be removed. Specifically, FIGS. 7-9 may be considered as depicting formation of spaced longitudinally elongated lines 12 having first sidewall spacers 18 formed longitudinally along sidewalls thereof. FIGS. 40-42 show removal of such spaced lines (not shown) from between first sidewall spacers 18.

Figure 43:
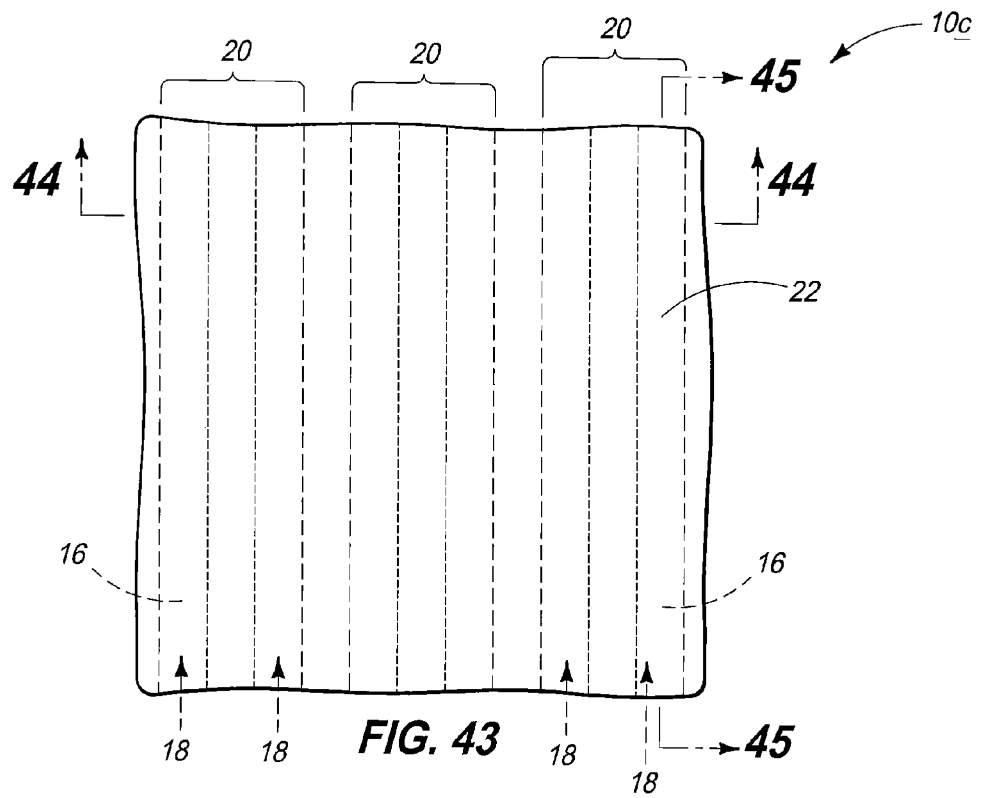
FIG. 43 is a view of the FIG. 40 substrate at a processing step subsequent to that shown by FIG. 40.
Figure 44:
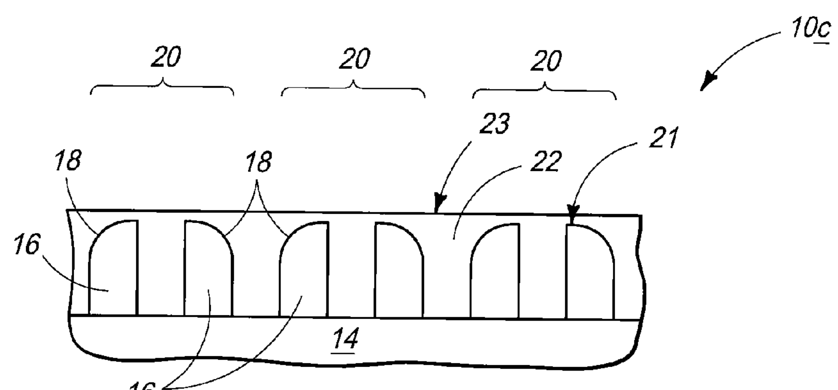
FIG. 44 is a cross sectional view taken through line 44-44 in FIG. 43.
Figure 45:
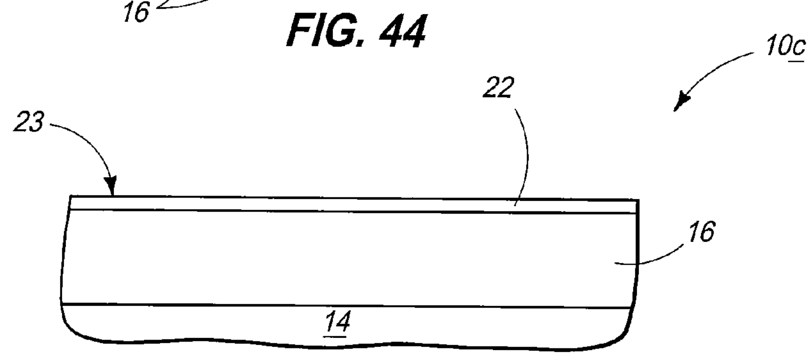
FIG. 45 is a cross sectional view taken through line 45-45 in FIG. 43.

In FIGS. 43-45, first fill material 22 has been deposited over first sidewall spacers 18, laterally between first sidewall spacers 18 where the removed spaced lines (not shown) were, and laterally between first sidewall spacers 18 of laterally adjacent first features 20. Any alternate or additional processing with respect to each of the above-described embodiments may further and/or alternately occur. As examples only, the first material may be planarized back to at least the elevationally outermost surfaces of the first spacers, or further elevationally inward to provide a co-planar elevationally outermost surface of the first lines, first sidewall spacers, and first fill material. Regardless, processing may occur subsequently in any of the example manners described above, or otherwise.

Further, the processing as just-described with respect to FIGS. 40-45 may alternately or additionally be conducted relative to formation of the second features. For example, formation of the second features may comprise forming spaced longitudinally elongated lines having second sidewall spacers received longitudinally along sidewalls thereof. Some or all of such spaced lines may be removed from between the second sidewall spacers. Thereafter, second fill material may be deposit over the second sidewall spacers, laterally between the second sidewall spacers where the removed space lines were, and laterally between the second sidewall spacers of laterally adjacent second features.

Any other combination of processing and construction attributes with respect to the above embodiments may be combined.

Figure 46:
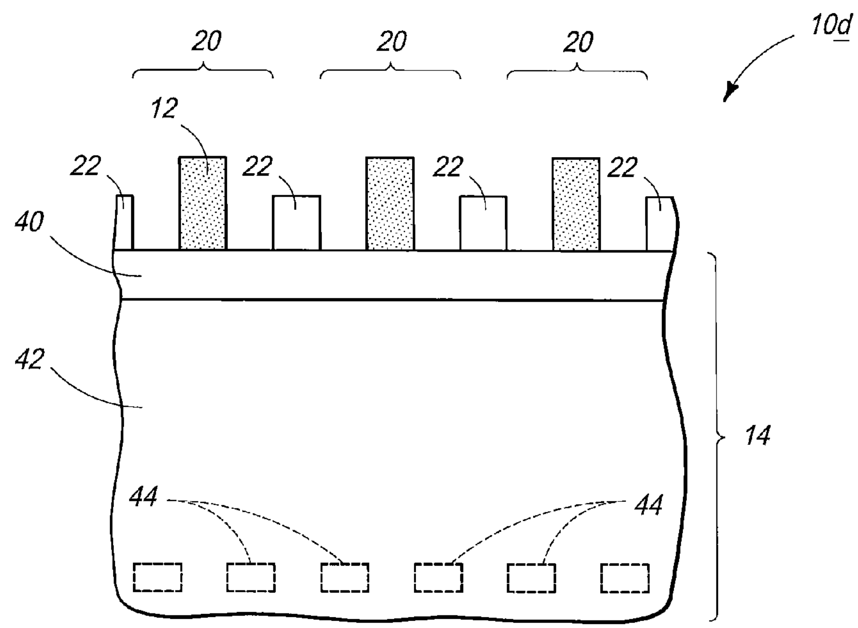
FIG. 46 is a diagrammatic cross sectional view of an alternate substrate to that of FIG. 29 which is in process in accordance with an embodiment of the invention.
Figure 47:
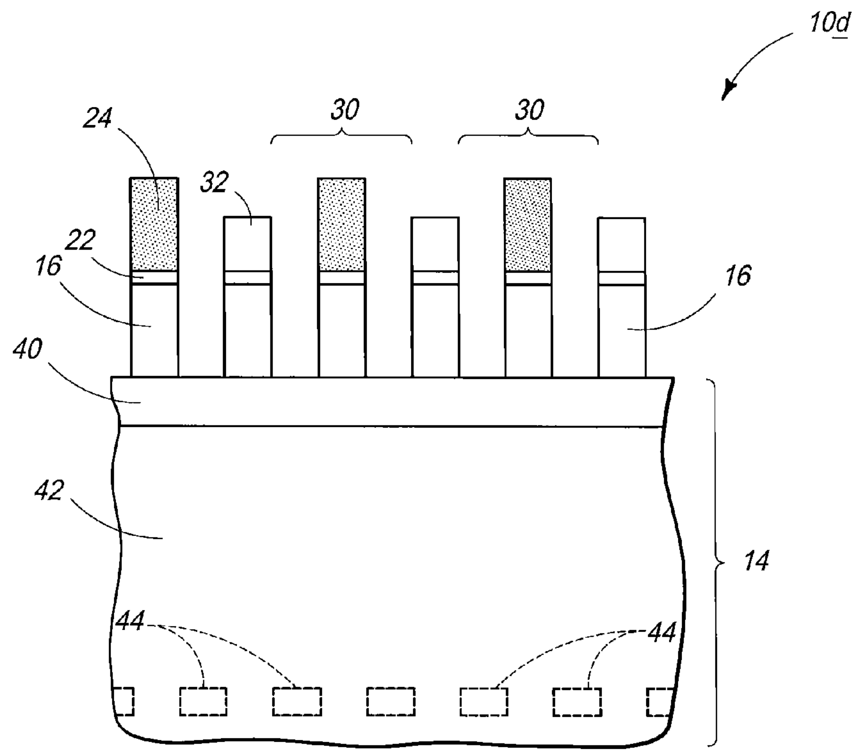
FIG. 47 is view of the FIG. 46 substrate corresponding in cross sectional cut location to that of FIG. 30.

Integrated circuitry components and/or other structures may be formed using, or may comprise, some or all of example pattern 35 (FIGS. 28-30) formed on a substrate. Alternately or additionally, such pattern may be used as a mask for subsequent processing of substrate material therebeneath. In one example embodiment after removing the portions of the first sidewall spacers to the underlying substrate, the underlying substrate may be etched into using remnant of the first and second features and the first and second fill materials as a mask. In one embodiment, a plurality of contact openings are formed which extend to node locations in the underlying substrate. One such example embodiment is described with reference to FIGS. 46-52. FIGS. 46 and 47 show a substrate fragment 10*d* the same as that of FIGS. 35 and 36, respectively, except for underlying substrate 14 as comprising a suitable outer hardmask material 40 formed over underlying material 42. Materials 40 and 42, respectively, may be homogenous or non-homogenous, for example comprising multiple different composition materials and/or layers. Example node locations 44 are shown within material 42. Regardless, the depicted remnant of first features 20, of second features 30, of first fill material 22, and of second fill material 32 may be considered as comprising an example first mask.

Figure 48:
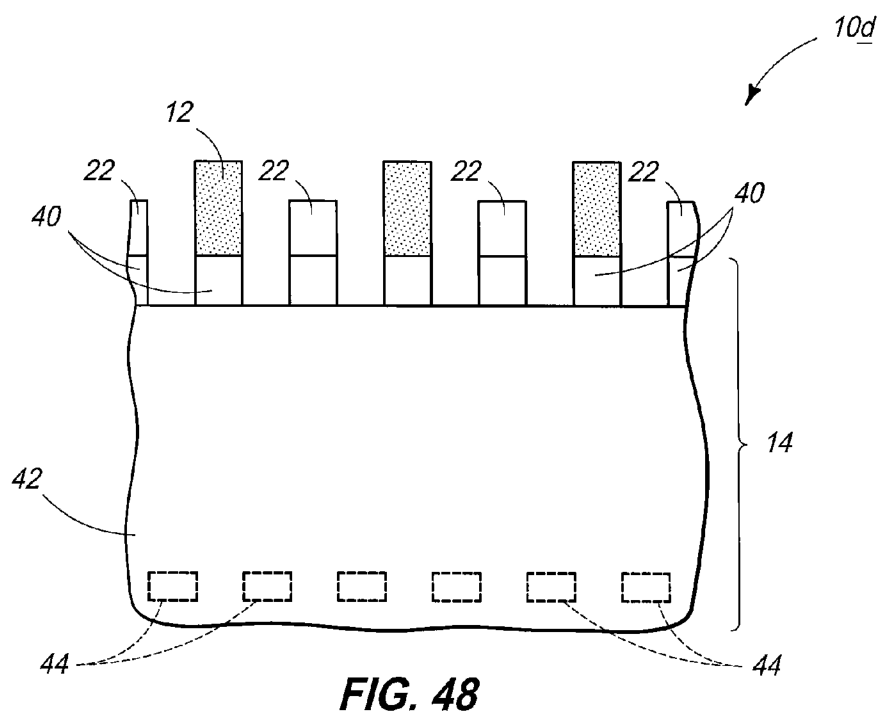
FIG. 48 is a view the FIG. 46 substrate at a processing step subsequent to that shown by FIG. 46.
Figure 49:
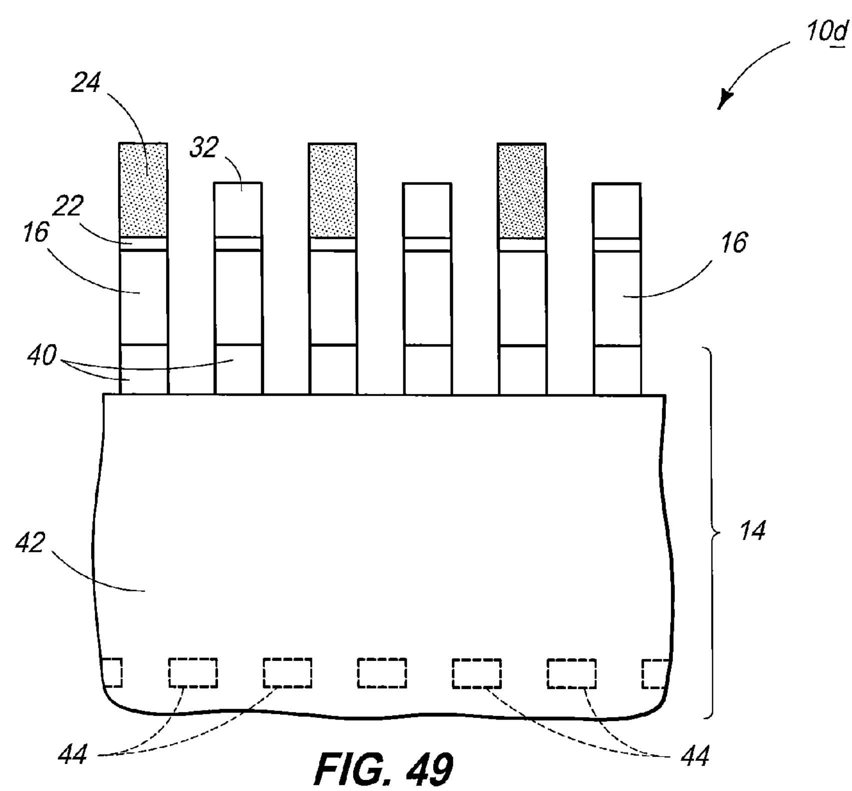
FIG. 49 is a view the FIG. 47 substrate at a processing step subsequent to that shown by FIG. 47.

Referring to FIGS. 48 and 49, such first mask has been used to form a contact opening pattern into hardmask material 40 by etching through openings in such first mask. Some, all, or none of the first mask may remain after the etching to form the depicted contact opening pattern in hardmask material 40. Further if any is remaining, such may be removed subsequently.

Figure 50:
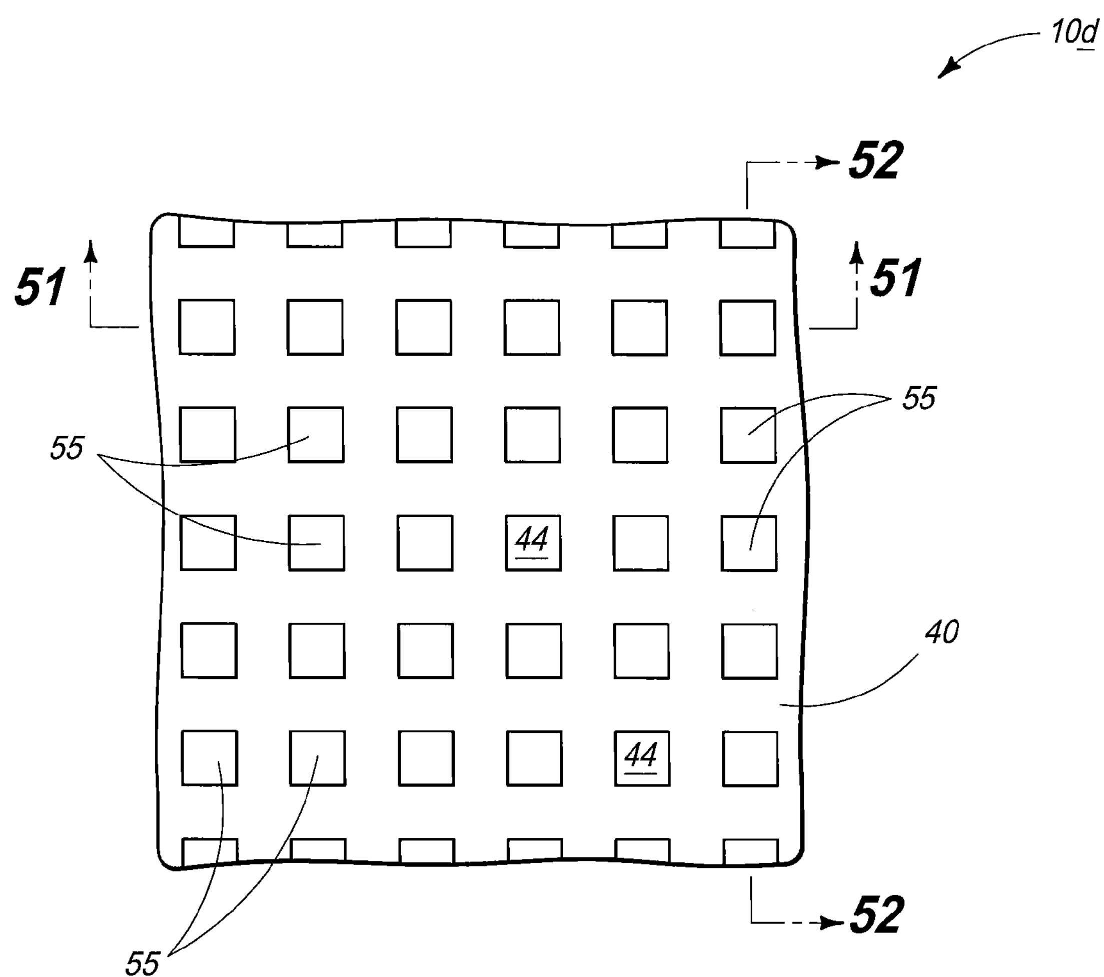
FIG. 50 is a diagrammatic top view of the FIGS. 48 and 49 substrate at a processing step subsequent to that shown by FIGS. 48 and 49.
Figure 51:
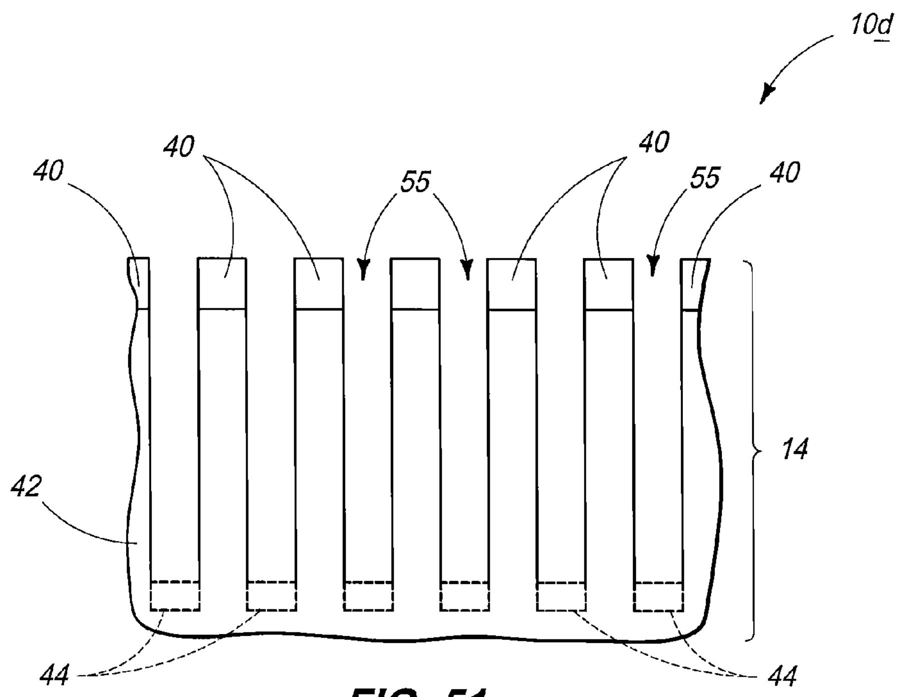
FIG. 51 is a cross sectional view taken through line 51-51 in FIG. 50.
Figure 52:
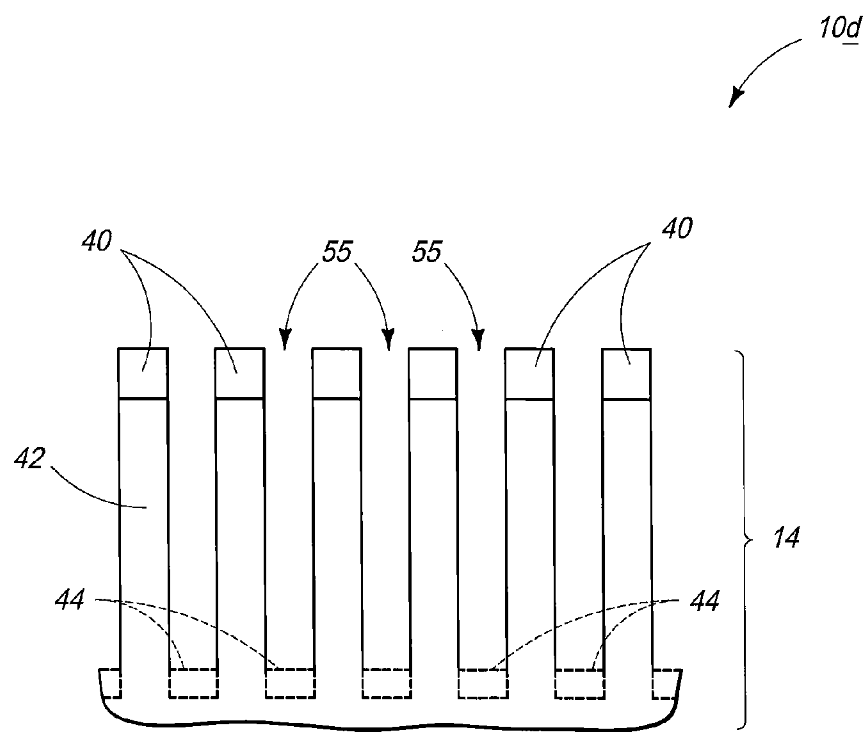
FIG. 52 is a cross sectional view taken through line 52-52 in FIG. 50.

Referring to FIGS. 50-52, a plurality of contact openings 55 has been etched into substrate material 42 using the contact opening pattern in hardmask material 40 as a second mask. Some, all, or none of the first mask (not shown) may remain after the FIGS. 50-52 etching if any remained over material 40 at the start of the FIGS. 50-52 etching.

In one embodiment, a method of forming a pattern on a substrate includes forming anisotropically etched first sidewall spacers elevationally over an underlying substrate. The above-described processing through FIG. 9 is but one example embodiment, and regardless of material or structure being received between first sidewall spacers 18. Anisotropically etched second sidewall spacers are formed elevationally over and cross the first sidewall spacers, and regardless of whether material is received between the first sidewall spacers when the anisotropically etched second spacers are formed. Intersections of the first and second sidewall spacers define respective elevationally overlapped areas of the first sidewall spacers where the second sidewall spacers cross over the first sidewall spacers. Processing as described above is but one such example embodiment wherein such example elevationally overlapped areas are designated with arrows 75 in the FIG. 19 embodiment, and regardless of whether material or structure is received between any of the first sidewall spacers or any of the second sidewall spacers.

The second sidewall spacers are removed where such cross over the first sidewall spacers and the overlapped areas of the first sidewall spacers are exposed. Such occurs regardless of the presence of fill or other material between any of the first and second sidewall spacers. Further, the removal of the second sidewall spacers may remove all of such or only some of such from the substrate. Regardless, material of the first sidewall spacers is removed through the exposed overlapped areas to the underlying substrate while at least a majority of the area of the first sidewall spacers outside of the overlapped areas is masked. By way of example only, FIGS. 28-30 show example such removal of material of first sidewall spacers 18 (not shown). Alternate and/or additional processing may otherwise occur as described above. For example and by way of example only, the second sidewall spacers may be formed directly against the first sidewall spacers, and the act of removing of the second sidewall spacers may inherently expose the overlapped areas of the first sidewall spacers. Alternately, the second sidewall spacers may not be formed directly against the first sidewall spacers, and the removing of the second sidewall spacers may not in such instance expose the overlapped areas of the first sidewall spacers. As an additional example, the elevationally outermost surfaces of the first sidewall spacers may initially be non-planar as formed. Such may subsequently be planarized prior to forming the second sidewall spacers.

In one embodiment, a method of forming a pattern on a substrate includes forming a repeating pattern of four first lines elevationally over an underlying substrate. For example and by way of example only with respect to the embodiments of FIGS. 1-30, four example first lines A, B, C, and D are shown in FIGS. 10, 11, and 26 as an example repeating pattern formed over an underlying substrate. A repeating pattern of four second lines is formed elevationally over and cross the repeating pattern of four first lines. By way of example only, such example repeating four second lines E, F, G, and H are shown in FIGS. 22 and 24.

First alternating ones of the four second lines are removed from being received over the first lines. By way of example only with respect to FIGS. 25 and 27, alternating second lines F and H (not shown) constitute such an example first alternating ones of such second lines which have been removed from being received over first lines A, B, C, and D. Subsequently, elevationally exposed portions of alternating ones of the four first lines are removed to the underlying substrate using a remaining second alternating of the four second lines as a mask. By way of example only, the processing of FIGS. 28-30 depicts one such example embodiment. For example, elevationally exposed portions of alternating first lines B and D (not shown) of the four first lines A, B, C, and D have been removed to underlying substrate 14 using a remaining second alternating ones E and G of the four second lines as a mask. Any alternate and/or additional processing as described above may be used.

In one embodiment, a method of forming a pattern on a substrate includes forming first and second lines elevationally over an underlying substrate. By way of example only, an immediately adjacent pair of two lines A in FIG. 10 constitute but example such first and second lines. Third and fourth lines are formed elevationally over and cross the first and second lines; with the first, second, third, and fourth lines forming a quadrilateral there-between. For example, with reference to FIG. 22, any immediately adjacent pair of two lines E constitutes an example such third and fourth lines which have been formed elevationally over and cross first lines A, A. An example quadrilateral Q is shown formed between/among such crossing lines. Any quadrilateral may be formed, including parallelograms, trapezoids, rectangles, squares, etc., with a square Q being shown in FIG. 22.

A pair of crossing lines is provided within the quadrilateral. For example with respect to quadrilateral Q, lines C and G formed therein constitutes an example pair of crossing lines. Such lines may be centered within the quadrilateral, otherwise positioned within the quadrilateral, and/or need not cross orthogonally relative one another.

The first, second, third, fourth, and the pair of crossing lines are used as a mask while etching through material to form a pattern of four openings which are individually received within a respective different one of four corners of the quadrilateral. For example and by way of example only with respect to the FIGS. 1-30 embodiment, an example four openings 45 (FIG. 28) are shown with respect to a quadrilateral Q and which are individually received within a respective different one of the four corners of such.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:

forming first features elevationally over an underlying substrate, the first features having first sidewall spacers on opposite sides thereof, first fill material being laterally between the first sidewall spacers of laterally adjacent first features;

forming second features elevationally over and crossing the first features, the second features having second sidewall spacers on opposite sides thereof, second fill material being laterally between the second sidewall spacers of laterally adjacent second features;

removing the second sidewall spacers from between the second features and the second fill material; and removing, to the underlying substrate, portions of the first sidewall spacers from between the first features and the first fill material that are not covered by the second features and the second fill material.

2. The method of claim 1 comprising after removing the portions of the first sidewall spacers to the underlying substrate, etching into the underlying substrate using remnant of the first and second features and the first and second fill materials as a mask to form a plurality of openings in the underlying substrate.

3. The method of claim 1 wherein the underlying substrate comprises an outer hardmask material, the etching comprising: etching an opening pattern into the hardmask material using the remnant of the first and second features and the first and second fill materials as a first mask; and etching the plurality of openings into substrate material underlying the hardmask material using the opening pattern in the hardmask material as a second mask.

4. The method of claim 3 comprising etching the first mask away from over the hardmask material.

5. The method of claim 1 wherein the first fill material and the first features are formed to be of different compositions.

6. The method of claim 1 wherein the first fill material and the first features are formed to be of the same composition.

7. The method of claim 1 wherein the first fill material is formed to have an elevationally outermost surface that is elevationally coincident with or elevationally outward of elevationally outermost surfaces of the first sidewall spacers.

8. The method of claim 7 wherein the elevationally outermost surface of the first fill material is planar, the elevationally outermost surfaces of the first sidewall spacers are at a common elevation, the elevationally outermost surface of the first fill material being elevationally coincident with the elevationally outermost surfaces of the first sidewall spacers.

9. The method of claim 7 wherein the elevationally outermost surface of the first fill material is planar, the elevationally outermost surface of the first fill material is elevationally outward of the elevationally outermost surfaces of the first spacers.

10. The method of claim 1 wherein forming the first features over which the second features are formed comprises planarizing the first features, the first sidewall spacers, and the first fill material elevationally inward to a coplanar elevationally outermost surface of the first features, the first sidewall spacers, and the first fill material.

11. The method of claim 1 wherein removing the second sidewall spacers exposes underlying portions of the first sidewall spacers.

12. The method of claim 11 wherein removing the second sidewall spacers exposes all of the lateral width of the respective first sidewall spacers.

13. The method of claim 11 wherein removing the second sidewall spacers exposes only some of the lateral width of the respective first sidewall spacers.

14. The method of claim 1 wherein removing the second sidewall spacers does not expose the underlying first sidewall spacers.

15. The method of claim 1 wherein the first and second features cross orthogonally relative one another.

16. The method of claim 1 wherein the first and second features cross non-orthogonally relative one another.

17. The method of claim 1 wherein the first fill material and the second fill material are of the same composition.

18. The method of claim 1 wherein the first fill material and the second fill material are of different compositions.

19. The method of claim 1 wherein the first fill material is elevationally over the first features and the first sidewall spacers, and over which the second features are formed; and after removing the second sidewall spacers, etching the first fill material to expose the first sidewall spacers and first features there-beneath.

20. The method of claim 1 wherein the removing of the portions of the first sidewall spacers comprises anisotropic etching of material of the first sidewall spacers selectively relative to the first features, the first fill material, the second features, and the second fill material.

21. A method of forming a pattern on a substrate, comprising:

forming anisotropically etched first sidewall spacers elevationally over an underlying substrate;

forming anisotropically etched second sidewall spacers elevationally over and crossing the first sidewall spacers, intersections of the first and second sidewall spacers defining respective elevationally overlapped areas of the first sidewall spacers where the second sidewall spacers cross over the first sidewall spacers;

removing the second sidewall spacers where such cross over the first sidewall spacers and exposing the overlapped areas of the first sidewall spacers; and removing material of the first sidewall spacers through the exposed overlapped areas to the underlying substrate.

22. The method of claim 21 wherein the second sidewall spacers are formed directly against the first sidewall spacers, and the removing of the second sidewall spacers exposes the overlapped areas of the first sidewall spacers.

23. The method of claim 21 wherein the second sidewall spacers are not formed directly against the first sidewall spacers, and the removing of the second sidewall spacers does not expose the overlapped areas of the first sidewall spacers.

24. The method of claim 21 wherein elevationally outermost surfaces of the first sidewall spacers are non-planar, and comprising planarizing the elevationally outermost surfaces of the first sidewall spacers prior to forming the second sidewall spacers.

25. The method of claim 21 wherein the removing of the second sidewall spacers removes all of such from the substrate.

26. A method of forming a pattern on a substrate, comprising:

forming a repeating pattern of four solid first features elevationally over an underlying substrate;

forming a repeating pattern of four solid second features elevationally over and crossing the repeating pattern of four solid first features, each immediately laterally adjacent individual pattern of the solid second features along at least one elevation is of different material composition relative one another;

after forming the solid first features and the solid second features, removing a set of first alternating solid second features of the four solid second features from being over the solid first features; and after removing the set of first alternating solid second features of the four solid second features, removing elevationally exposed portions of alternating solid first features of the four solid first features to the underlying substrate using a remaining set of second alternating solid second features of the four solid second features as a mask.

* * * * *